(12) United States Patent
Tortorelli et al.

(10) Patent No.: US 10,102,891 B2
(45) Date of Patent: Oct. 16, 2018

(54) DOUBLE-POLARITY MEMORY READ

(71) Applicant: Intel Corporation, Santa Clara, CA (US)

(72) Inventors: Innocenzo Tortorelli, Cernusco sul Naviglio (IT); Federico Pio, Vimercate (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/786,317

(22) Filed: Oct. 17, 2017

(65) Prior Publication Data

US 2018/0102149 A1 Apr. 12, 2018

Related U.S. Application Data

(63) Continuation of application No. 15/278,983, filed on Sep. 28, 2016, now Pat. No. 9,799,381.

(51) Int. Cl.
*G11C 7/22* (2006.01)
*G11C 7/06* (2006.01)
*G11C 13/00* (2006.01)

(52) U.S. Cl.
CPC ............... *G11C 7/22* (2013.01); *G11C 7/062* (2013.01); *G11C 13/0004* (2013.01)

(58) Field of Classification Search
CPC ........ G11C 7/22; G11C 7/062; G11C 13/0004
See application file for complete search history.

(56) References Cited

U.S. PATENT DOCUMENTS

| 2008/0310218 A1 | 12/2008 | Hachino |
| 2009/0154232 A1 | 6/2009 | Norman |
| 2012/0075914 A1 | 3/2012 | Bateman et al. |
| 2013/0028004 A1 | 1/2013 | Snider |
| 2014/0126307 A1 | 5/2014 | Luthra |
| 2016/0111150 A1 | 4/2016 | Bazarsky et al. |
| 2017/0229169 A1* | 8/2017 | Jo ................ G11C 13/004 |

(Continued)

FOREIGN PATENT DOCUMENTS

| KR | 100934159 B1 | 12/2009 |
| WO | 2016137446 A1 | 9/2016 |

OTHER PUBLICATIONS

International Search Report and Written Opinion for PCT Patent Application No. PCT/US2017/047999, dated Nov. 14, 2017, 11 pages.

(Continued)

*Primary Examiner* — Uyen B Tran
(74) *Attorney, Agent, or Firm* — Compass IP Law PC

(57) ABSTRACT

Circuits, systems, and methods for double-polarity reading of double-polarity stored data information are described. In one embodiment, a method involves applying a first voltage with a first polarity to a plurality of the memory cells. The method involves applying a second voltage with a second polarity to one or more of the plurality of memory cells. The method involves detecting electrical responses of the one or more memory cells to the first voltage and the second voltage. The method also involves determining a logic state of the one or more memory cells based on the electrical responses of the one or more memory cells to the first voltage and the second voltage.

20 Claims, 19 Drawing Sheets

(56) References Cited

U.S. PATENT DOCUMENTS

2018/0040370 A1* 2/2018 Tortorelli ............ G11C 11/5678
2018/0102184 A1* 4/2018 Zhou ................ G11C 29/50008

OTHER PUBLICATIONS

Office Action for U.S. Appl. No. 15/278,983, dated Jan. 12, 2017, 17 pages.
Pre-publication version of patent application titled, "Apparatuses and Methods Including Memory and Operation of Same,", 41 pages.
Yi-Chou Chen, et al., An Access-Transistor-Free (0T/1R) Non-Volatile Resistance Random Access Memory (RRAM) Using a Novel Threshold Switching, Self-Rectifying Chalcogenide Device, Macronix International Co., Ltd., No. 16, Li-Hsin Road, Science-Based Industrial Park, Hsin-Chu, Taiwan, ROC, 2003 IEE. 4 pages.

* cited by examiner

| | PROGRAMMING POLARITY 421 | <$V_{TH}$ (POS READ)> 422 | <$V_{TH}$ (NEG READ)> 424 |
|---|---|---|---|
| 426 | A POSITIVE B NEGATIVE ($V_A > V_B$) | $V_{TH}$ Low1 | -$V_{TH}$ High1 |
| 428 | A NEGATIVE B POSITIVE ($V_A < V_B$) | $V_{TH}$ High2 | -$V_{TH}$ Low2 |

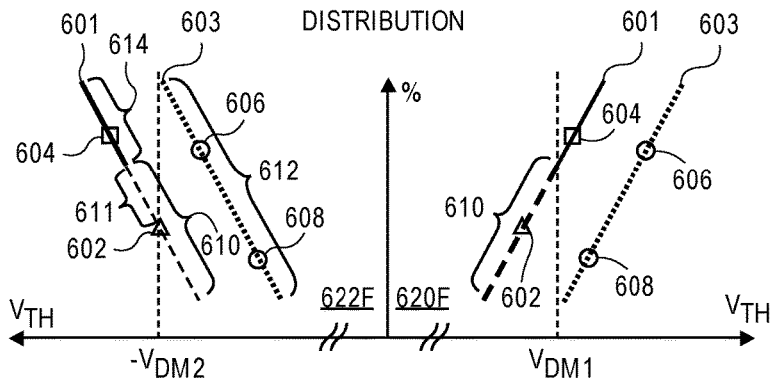
FIG. 6F
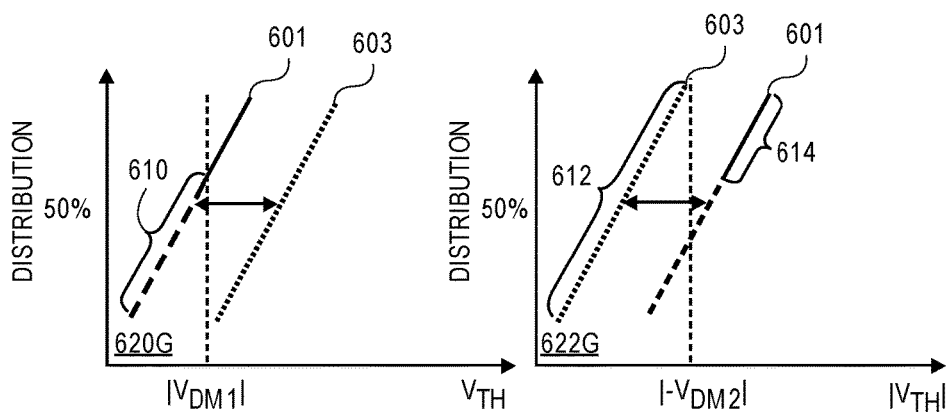
FIG. 6G
| | DATA (LOGIC STATE) 642 | THRESHOLD IN RESPONSE TO $V_{DM1}$? 644 | THRESHOLD IN RESPONSE TO $-V_{DM2}$? 646 | OUTPUT (LOGIC STATE) 648 |
|---|---|---|---|---|
| 650 | 1 | YES | SCREEN | 1 |
| 651 | 1 | NO | NO | 1 |
| 652 | 0 | NO | YES | 0 |
FIG. 6H

"1"

WAFER TOP - PRG: POSITIVE 920

| READ \ % | 0.12 | 0.50 | 0.88 |
|---|---|---|---|
| Positive | 4.61 | 4.685 | 4.76 |
| Negative | -5.18 | -5.32 | -5.46 |

WAFER CENTER - PRG: POSITIVE 924

| READ \ % | 0.12 | 0.50 | 0.88 |
|---|---|---|---|
| Positive | 4.96 | 5.09 | 5.22 |
| Negative | -5.68 | -5.83 | -5.98 |

"0"

WAFER TOP - PRG: NEGATIVE 922

| READ \ % | 0.12 | 0.50 | 0.88 |
|---|---|---|---|
| Positive | -4.60 | -4.71 | -4.82 |
| Negative | 5.02 | 5.16 | 5.30 |

WAFER CENTER - PRG: NEGATIVE 926

| READ \ % | 0.12 | 0.50 | 0.88 |
|---|---|---|---|
| Positive | -4.82 | -5.07 | -5.32 |
| Negative | 5.56 | 5.71 | 5.86 |

FIG. 9C

DOUBLE-POLARITY MEMORY READ

RELATED APPLICATIONS

This application is a continuation of and claims the benefit of priority of U.S. patent application Ser. No. 15/278,983, titled "DOUBLE-POLARITY MEMORY READ," filed Sep. 28, 2016, which is hereby incorporated by reference in its entirety.

FIELD

The descriptions are generally related to techniques for accessing memory cells, and more particularly, descriptions are related to double-polarity memory reads.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2016, Intel Corporation, All Rights Reserved.

BACKGROUND

Memory resources have innumerable applications in electronic devices and other computing environments. Continued drive to smaller and more energy efficient devices has resulted in scaling issues with traditional memory devices. Thus, there is a current demand for memory devices that can potentially scale smaller than traditional memory devices. However, some memory technologies that scale smaller than traditional devices can experience relatively high rates of errors. Computing systems typically implement error detection and correction mechanisms to handle errors and prevent system crashes, loss of information, or both. However, error correction mechanisms can increase system cost, occupy space on a die, and increase the amount of time for accurate retrieval of data from memory. Such drawbacks can be especially significant for larger or more complex error correcting systems used for memories with high error rates.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIGS. 6A-6G are graphs illustrating distributions of threshold voltages exhibited by memory cells during performance of a double-polarity read, in accordance with an embodiment.

FIG. 6H is a chart illustrating outcomes of a double-polarity read corresponding to the graphs of FIGS. 6A-6G, in accordance with an embodiment.

FIG. 9C includes tables that show the threshold voltages at different percentiles of the distributions illustrated in FIGS. 9A and 9B, in accordance with an embodiment.

Figure 1:
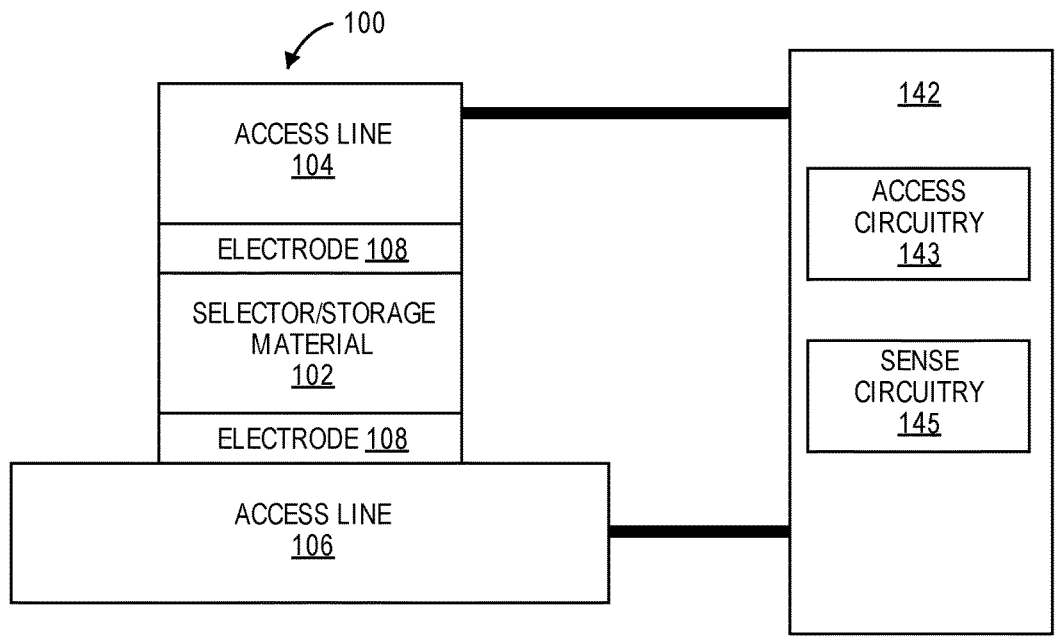
FIG. 1 is a diagram of a memory cell that can be read using a double-polarity read sequence, in accordance with an embodiment.

Descriptions of certain details and implementations follow, including a description of the figures, which may depict some or all of the embodiments described below, as well as discussing other potential embodiments or implementations of the inventive concepts presented herein.

DETAILED DESCRIPTION

Double-polarity memory reads are described herein. In one embodiment, a memory cell array includes memory cells that can be programmed by applying voltage pulses to the cells. In one embodiment, writing information to memory cells involves applying voltage pulses with particular polarities to the memory cells. For example, programming a memory cell with a voltage pulse with one polarity results in the memory cell being in one logic state (e.g., a "logic 0"), and programming the memory cell with a voltage pulse with a different polarity results in the memory cell being in a different logic state (e.g., "logic 1"). Similarly, reading such memory cells can involve applying voltage pulses to the memory cells and detecting electrical responses from the memory cells.

One technique for reading such memory cells involves applying a voltage pulse with one particular polarity (e.g., a single-polarity read) to the memory cells. The electrical responses of the memory cells to the single-polarity read depend on the polarity of both the read and write voltage pulses. In some cases, the electrical responses of the memory cells programmed to logic 0 are sufficiently different from the electrical responses of the memory cells programmed to logic 1 to enable a single-polarity read to correctly determine the information stored in memory cells. However, in other cases, there can be significant overlap in the electrical responses of memory cells programmed with logic 0 and memory cells programmed with logic 1. In such cases where overlap exists, a single-polarity read may frequently output the incorrect value, resulting in a high error rate.

Unlike a single-polarity memory read, a double-polarity memory read involves a sequence of voltage pulses with different polarities, in accordance with embodiments. For example, in one embodiment, a double-polarity read involves first applying a pulse having a positive polarity relative to a reference voltage, and then applying a pulse with a negative polarity relative to the reference voltage. In one such embodiment, the double-polarity read involves determining the logic state of a given memory cell based on the memory cell's responses to the first and second voltage pulses. For example, based on the first voltage pulse, the logic state of some if not most of the logic 1 cells can be correctly ascertained. In one such example, after the first voltage pulse, the logic state of the remaining logic 1 cells as well as the logic 0 cells are considered indeterminate. A second voltage pulse applied to at least the indeterminate cells can resolve the indeterminacy. Accordingly, a double-polarity read sequence can enable accurate recovery of information from a memory cell that might otherwise output the incorrect value when read in accordance with conventional methods.

FIG. 1 illustrates one example of a memory cell that can be read using a double-polarity reading technique, in accordance with an embodiment.

In the embodiment illustrated in FIG. 1, the memory cell 100 includes a storage material 102 between access lines 104 and 106. The access lines 104, 106 electrically couple the memory cell 100 with circuitry 142 that writes to and reads the memory cell 100. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

In one embodiment, the storage material 102 includes a self-selecting material that exhibits memory effects. A self-selecting material is a material that enables selection of a memory cell in an array without requiring a separate selector element. Thus, FIG. 1 illustrates the storage material 102 as a "selector/storage material." A material exhibits memory effects if circuitry for accessing memory cells can cause the material to be in one of multiple states (e.g., via a write operation), and later determine the programmed state (e.g., via a read operation). Circuitry for accessing memory cells (e.g., via read and write operations) is referred to generally as "access circuitry," and is discussed further below with reference to the access circuitry 143. Access circuitry can store information in the memory cell 100 by causing the storage material 102 to be in a particular state. The storage material 102 can include, for example, a chalcogenide material such as Te—Se alloys, As—Se alloys, Ge—Te alloys, As—Se—Te alloys, Ge—As—Se alloys, Te—As—Ge alloys, Si—Ge—As—Se alloys, Si—Te—As—Ge alloys, or other material capable of functioning as both a storage element and a selector, to enable addressing a specific memory cell and determining what the state of the memory cell is. Thus, in one embodiment, the memory cell 100 is a self-selecting memory cell that includes a single layer of material that acts as both a selector element to select the memory cell and a memory element to store a logic state.

In one embodiment, the storage material 102 is a phase change material. A phase change material can be electrically switched between a generally amorphous and a generally crystalline state across the entire spectrum between completely amorphous and completely crystalline states. In another embodiment, the storage material 102 is not a phase change material. In one embodiment in which the storage material 102 is not a phase change material, the storage material is capable of switching between two or more stable states without changing phase. In one such embodiment, the access circuitry 143 programs the memory cell 100 by applying a voltage with a particular polarity to cause the storage material 102 to be in the desired stable state.

In one such embodiment, programming the memory cell 100 causes the memory cell 100 to "threshold" or undergo a "threshold event." When a memory cell thresholds (e.g., during a program voltage pulse), the memory cell undergoes a physical change that causes the memory cell to exhibit a certain threshold voltage in response to the application of a subsequent voltage (e.g., a read voltage with a particular magnitude and polarity). Programming the memory cell 100 can therefore involve applying a voltage of a given polarity to induce a programming threshold event, which causes the memory cell 100 to exhibit a particular threshold voltage at a subsequent reading voltage of a same or different polarity. In one such embodiment, the storage material 102 is a self-selecting material (e.g., a non-phase change chalcogenide material or other self-selecting material) that can be programmed by inducing a threshold event.

As is explained in further detail below, in one embodiment, the output of such a memory cell when read differs as a function of the polarity used to program the memory cell and the polarity used to read the memory cell. For example, in one embodiment, the storage material 102 exhibits a "lower threshold voltage" or a "higher threshold voltage" in response to a read voltage pulse based on the polarity of both the programming and read voltages. In one embodiment, exhibiting a threshold voltage means that there is a voltage across the memory cell that is approximately equal to the threshold voltage in response to the application of a voltage with a particular magnitude and polarity to the terminals of the memory cell.

As mentioned above, the access lines 104, 106 electrically couple the memory cell 100 with circuitry 142. The access lines 104, 106 can be referred to as a bitline and wordline, respectively. The wordline is for accessing a particular word in a memory array and the bitline is for accessing a particular bit in the word. The access lines 104, 106 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 108 are disposed between storage material 102 and access lines 104, 106. Electrodes 108 electrically couple access lines 104, 106 with storage material 102. Electrodes 108 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include any suitable metal including, for example, metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

Referring again to the circuitry 142, the access lines 104, 106 communicatively couple the circuitry 142 to the memory cell 100, in accordance with an embodiment. The circuitry 142 includes access circuitry 143 and sense circuitry 145, in accordance with an embodiment. Circuitry includes electronic components that are electrically coupled to perform analog or logic operations on received or stored information, output information, and/or store information. Hardware logic is circuitry to perform logic operations such as logic operations involved in data processing. In one embodiment, the access circuitry 143 applies voltage pulses to the access lines 104, 106 to write to or read the memory cell 100. The terms "write" and "program" are used interchangeably to describe the act of storing information in a memory cell. In one embodiment, to write to the memory cell 100, the access circuitry applies a voltage pulse with a particular magnitude and polarity to the access lines 104, 106, which can both select memory cell 100 and program memory cell 100.

In one embodiment, the access circuitry 143 applies a pulse with one polarity to program the memory cell 100 to be in one logic state, and applies a pulse with a different polarity to program the memory cell 100 to be in a different logic state. The access circuitry 143 can then differentiate between different logic states as a consequence of the programming polarity of a memory cell. For example, in a case of a memory read, in one embodiment, the access circuitry 143 applies a voltage pulse with a particular magnitude and polarity to the access lines 104, 106, which results in an electrical response that the sense circuitry 145 can detect. Detecting electrical responses can include, for example, detecting one or more of: a voltage drop (e.g., a threshold voltage) across terminals of a given memory cell of the array, current through the given memory cell, and a threshold event of the given memory cell. In some cases, detecting a threshold voltage for a memory cell can include determining that the cell's threshold voltage is lower than or higher than a reference voltage, for example a read voltage. The access circuitry 143 can determine the logic state of the memory cell 100 based on electrical responses to one or more of the voltage pulses in the read sequence.

The memory cell 100 is one example of a memory cell that can be read with a double-polarity read. Other embodiments can include memory cells having additional or different layers of material than illustrated in FIG. 1 (e.g., a thin dielectric material between the storage material and access lines).

Figure 2:
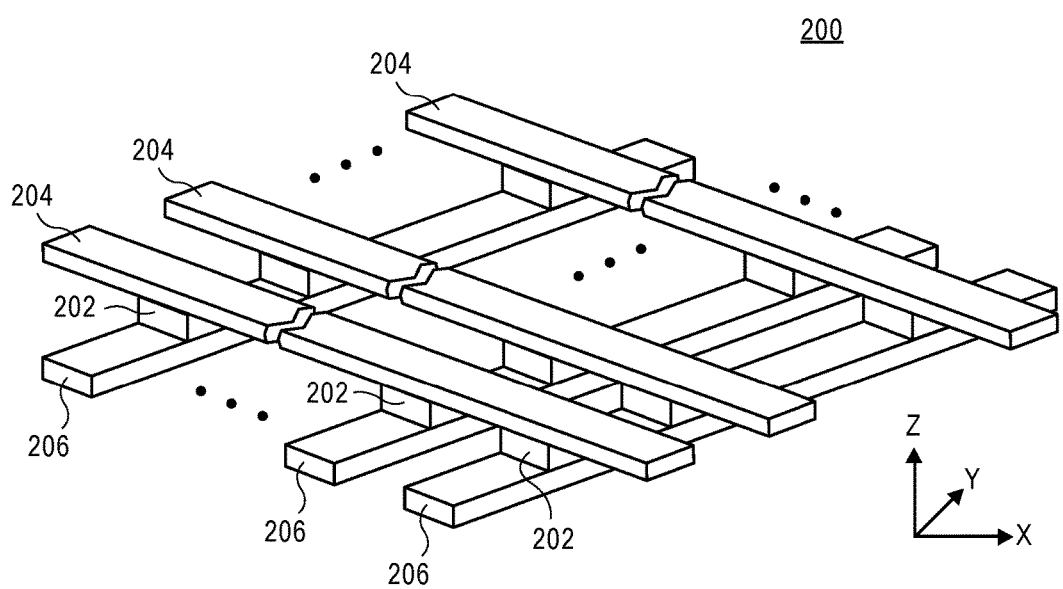
FIG. 2 illustrates a portion of a memory cell array, in accordance with an embodiment.

FIG. 2 illustrates a portion of a memory cell array 200, which can include a memory cell such as the memory cell 100 of FIG. 1, in accordance with an embodiment. Memory cell array 200 is an example of a three dimensional (3D) cross-point memory structure. The memory cell array 200 includes a plurality of access lines 204, 206, which can be the same or similar as the access lines 104, 106 described with respect to FIG. 1. Access lines 204, 206 can be referred to as bitlines and wordlines. In the embodiment illustrated in FIG. 2, the bitlines (e.g., access lines 204) are orthogonal to the wordlines (e.g., access lines 206). A storage material 202 (such as the storage material 102 of FIG. 1) is disposed between the access lines 204, 206. In one embodiment, a "cross-point" is formed at an intersection between a bitline, a wordline. A memory cell is created from the storage material 202 between the bitline and wordline where the bitline and wordline intersect. The storage material 202 can be a chalcogenide material such as the storage material 102 described above with respect to FIG. 1. In one embodiment, the access lines 204, 206 are composed of one or more conductive materials such as the access lines 104, 106 described above with respect to FIG. 1. Although a single level or layer of memory cells is shown in FIG. 2, memory cell array 200 can include multiple levels or layers of memory cells (e.g., in the z-direction). FIGS. 1 and 2 illustrate an example of a memory cell and array in which double-polarity reads can be implemented. However, double-polarity reads can be implemented in other memory cell structures and arrays in which the memory cells exhibit electrical responses that vary as a function of programming and read polarity.

Figure 3A:
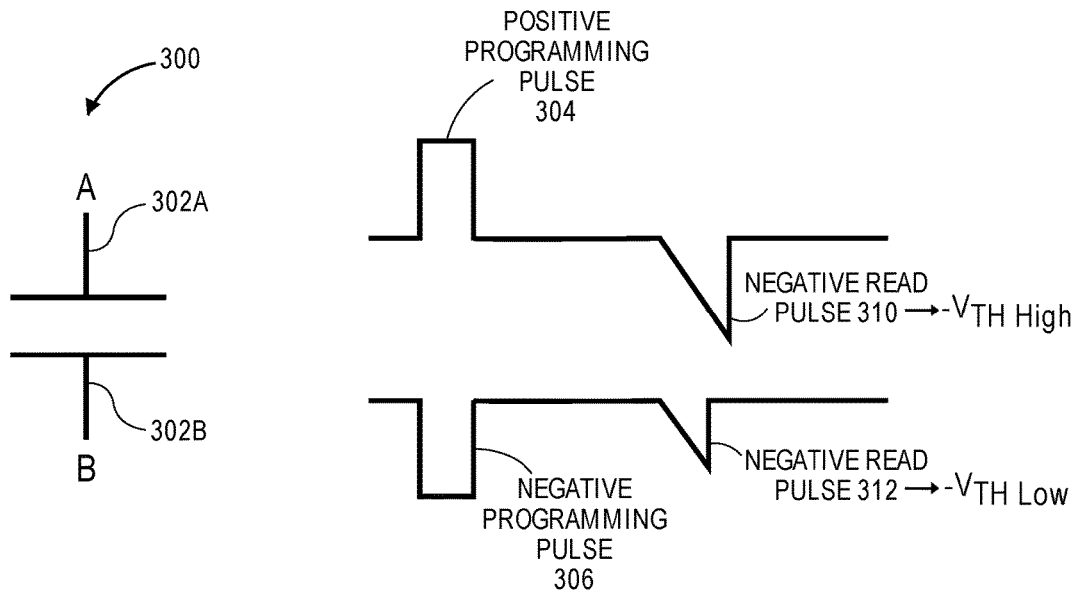
FIG. 3A is a diagram illustrating a single-polarity read of a memory cell, in accordance with an embodiment.
Figure 3B:
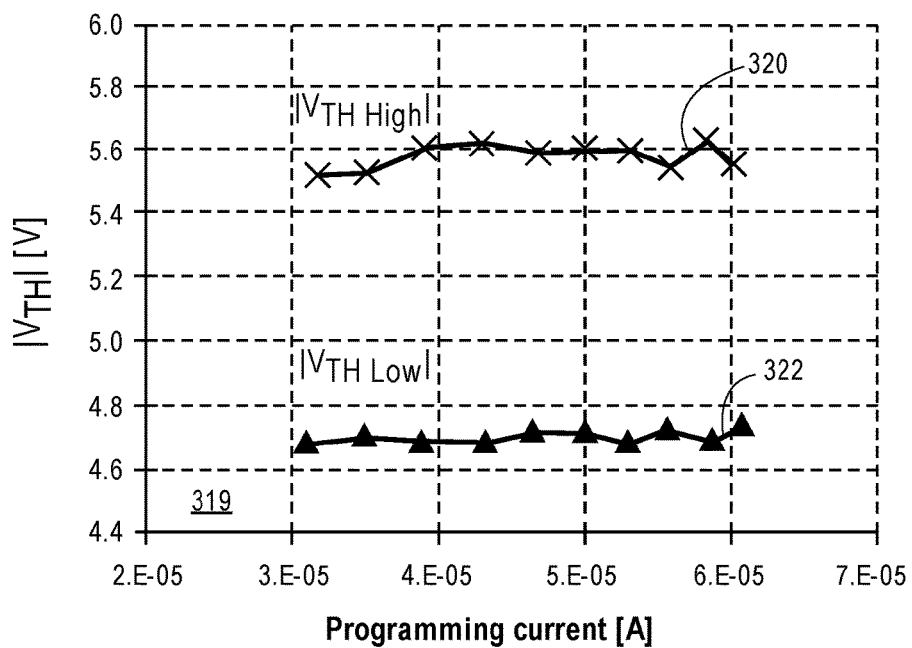
FIG. 3B is a graph of experimental data showing lower and higher threshold voltages exhibited by a memory cell, in accordance with an embodiment.

FIGS. 3A and 3B illustrate how the polarity of programming and read voltage pulses can affect the threshold voltage exhibited by a memory cell such as the memory cell 100 of FIG. 1, in accordance with embodiments. FIG. 3A is a diagram illustrating a single-polarity read of a memory cell, in accordance with an embodiment. FIG. 3B is a graph illustrating threshold voltages with lower and higher magnitudes, in accordance with an embodiment.

Referring to FIG. 3A, a memory cell 300 has terminals 302A, 302B (labeled A and B, respectively) for accessing the memory cell 300. In one embodiment, terminals A and B are access lines, such as the access lines 104 and 106 of FIG. 1 or access lines 204 and 206 of FIG. 2. Access circuitry (such as the access circuitry 143 referred to in FIG.

1) can write to or read the memory cell 300 by applying a voltage having a particular magnitude and polarity to the terminals 302A, 302B of the memory cell, in accordance with embodiments. For example, FIG. 3A shows a "positive" programming pulse 304 and a "negative" programming pulse 306. A positive programming pulse refers to a programming pulse with "positive polarity," which can also be referred to as "forward polarity." A negative programming pulse is a voltage pulse with "negative polarity," which can also be referred to as "reverse polarity." In one embodiment, whether or not a programming pulse is positive or negative is based on the relative voltages applied to the terminals 302A, 302B. A voltage pulse can be defined as positive if the voltage applied to one of the terminals is more positive than the voltage applied to a second of the terminals. For example, referring to FIG. 3A, a positive voltage pulse can include: a positive voltage applied to terminal 302A and a negative voltage applied to terminal 302B; a positive voltage applied to terminal 302A and 0 V (e.g., circuit ground or neutral reference) applied to terminal 302B; 0V applied to terminal 302A and a negative voltage applied to terminal 302B, a positive voltage applied to both terminals 302A and 302B, but where the voltage applied to 302A is greater than the voltage applied to 302B; or a negative voltage applied to both terminals 302A and 302B, but where the voltage applied to 302A is greater than the voltage applied to 302B.

In such an embodiment, a voltage pulse applied to the terminals of the memory cell would be negative if the voltage applied to terminal 302A is more negative than the voltage applied to terminal 302B. For example, a negative voltage pulse can include: a negative voltage applied to terminal 302A and a positive voltage applied to terminal 302B; a negative voltage applied to terminal 302A and 0 V (e.g., circuit ground or neutral reference) applied to terminal 302B; 0V applied to terminal 302A and a positive voltage applied to terminal 302B, a negative voltage applied to both terminals 302A and 302B, but where the magnitude of the voltage applied to 302A is greater than the magnitude of the voltage applied to 302B; or a positive voltage applied to both terminals 302A and 302B, but where the magnitude of the voltage applied to 302B is greater than the magnitude of the voltage applied to 302A.

FIG. 3A shows a particular definition of "positive" and "negative" relative to terminals 302A, 302B for illustrative purposes, however, embodiments can define positive and negative differently. For example, an embodiment can define a positive programming pulse to be a voltage pulse in which the voltage applied to terminal 302B is more positive than the voltage applied to terminal 302A.

As mentioned above, in one embodiment, access circuitry can both write to and read a memory cell by applying a voltage with a particular magnitude and polarity to the cell. In one embodiment, access circuitry can write different values or logic states to the memory cell by applying voltages with different polarities. For example, the access circuitry can apply a positive programming pulse (e.g., positive programming pulse 304) to write one logic state, and a negative programming pulse (e.g., negative programming pulse 306) to write a different logic state. For ease of reference, the following description refers to a positive programming pulse as writing a "logic 1" to memory cell and a negative programming pulse as writing a "logic 0" to a memory cell, although a different convention can be adopted. For example, in one embodiment, access circuitry can apply a negative programming pulse to write a logic 1 and a positive programming pulse to write a logic 0.

In one embodiment, whether or not a voltage applied to a memory cell programs the cell depends upon the magnitude and duration of the applied voltage. For example, in one embodiment, access circuitry applies a programming pulse, such as the programming pulse 304 or 306, with a magnitude sufficient to cause the memory cell to threshold. For example, in one embodiment, the access circuitry can apply a voltage with a magnitude that is greater than or equal to the highest expected threshold voltage exhibited by the memory cell. In some embodiments the duration of a programming voltage pulse is 10 ns-50 ns. In some embodiments, the duration of the programming voltage pulse is 1-100 ns. In some embodiments, the duration of the programming voltage pulse is 1 ns-1 µs. In one embodiment, the duration of programming pulses and read pulses is the same.

Different embodiments can involve applying read and write voltage pulses of different shapes. In the embodiment illustrated in FIG. 3A, the programming pulses 304 and 306 are shown as box-shaped pulses (also known as rectangular-shaped or square-shaped pulses), and the read pulses 310, 312 are shown as ramped pulses. In one embodiment, the read pulses 310, 312 ramp up or down to a read voltage magnitude (e.g., to $-V_{TH\ High}$ and $-V_{TH\ Low}$ in the embodiment illustrated in FIG. 3A). In actual implementations, the voltage pulses may have leading or trailing edges, in accordance with embodiments. Other embodiments can apply write and read pulses having shapes such as triangular (e.g., ramped pulses), trapezoidal, rectangular, box, and/or sinusoidal shapes. Thus, circuitry for accessing memory cells can apply programming pulses having a variety of shapes and durations sufficient to cause the memory cells to threshold into the desired state.

One method of reading memory cells involves applying a voltage pulse to the memory cell with a single polarity. For example, FIG. 3A shows an example of a single-polarity read. In one such embodiment, access circuitry applies a voltage pulse with only a single particular polarity to the memory cells. Sense circuitry can detect the electrical response of a given memory cell to the single-polarity pulse. In the example illustrated in FIG. 3A, reading the memory cell 300 involves applying a negative voltage pulse, such as negative read pulses 310 and 312. Although FIG. 3A illustrates negative read pulses 310, 312, access circuitry can also perform a single-polarity read using only positive voltage pulses to perform a single-polarity read.

In one embodiment, if the read voltage pulse has a different polarity than the programming pulse, such as in the case of positive programming pulse 304 and negative read pulse 310, the memory cell exhibits a threshold voltage with a higher magnitude ($-V_{TH\ High}$). In one such embodiment, if the read voltage pulse has the same polarity as the programming pulse, the memory cell exhibits a threshold voltage with a lower magnitude ($-V_{TH\ Low}$). In the embodiment illustrated in FIG. 3A, the polarity of the resulting threshold voltage is negative because the read voltage pulses are negative. Thus, in accordance with an embodiment, when performing single polarity reads, the memory cell exhibits a threshold voltage with a higher magnitude (e.g., $|-V_{TH\ High}|$) when the memory cell is in one logic state, and a threshold voltage with a lower magnitude ($|-V_{TH\ Low}|$) when the memory cell is in another logic state. Access circuitry can thus determine the logic state of a given cell based on whether the memory cell exhibits a higher or lower magnitude threshold voltage.

FIG. 3B is a graph 319 showing threshold voltages with a higher and lower magnitude, in accordance with an embodiment. The graph 319 includes experimental data (threshold voltages) collected from memory cells in response to application of different programming currents. Thus, the x-axis of the graph 319 is the magnitude (absolute value) of the programming current and the y-axis of the graph 319 is the magnitude (absolute value) of the resulting threshold voltage in response to the programming current. As mentioned above, depending upon the programming and read polarities, the threshold voltage magnitude exhibited by a memory cell will be higher (e.g., $V_{TH\ High}$) or lower (e.g., $V_{TH\ Low}$). The graph 319 in FIG. 3B shows that the memory cells exhibit the higher and lower threshold voltages for a range of programming currents. The graph 319 also shows that the higher and lower threshold voltages are actually ranges of voltages. For example, the higher threshold voltage magnitudes 320 are a range of magnitudes clustered at approximately 5.6V in the illustrated example. Similarly, the lower threshold voltage magnitudes 322 are a lower range of magnitudes approximately centered around 4.7V in the illustrated example. The ranges of lower and higher threshold voltage magnitudes are separated by a window.

As is described in greater detail below with respect to FIG. 4C, the window between the ranges of threshold voltage magnitudes can affect the ability to reliably write to and read the memory cells. According to one embodiment, if the window between the threshold voltage ranges is sufficiently large (e.g., if the ranges of threshold voltages are sufficiently spaced apart), then access circuitry may be able to reliably distinguish between a logic 1 and 0 in response to a single-polarity read. For example, if the threshold voltage ranges are sufficiently spaced apart, access circuitry may be able to accurately read the memory cell by applying a single read voltage approximately at a mid-point between the low and high threshold voltages (e.g., about 5.1V in the example illustrated in FIG. 3B). In one such example, applying a single read voltage at the mid-point between the low and high threshold voltages would cause memory cells programmed with the negative programming pulse 306 to threshold, but not the memory cells programmed with the positive programming pulse 304. Accordingly, access circuitry could distinguish the logic state of the memory cells by determining which memory cells thresholded in response to the single read voltage. However, if the window between the threshold voltage ranges is small, or if the threshold voltage ranges overlap, it can be difficult to reliably distinguish between a logic 1 or 0 with a single-polarity read.

Figures 4A, 4B:
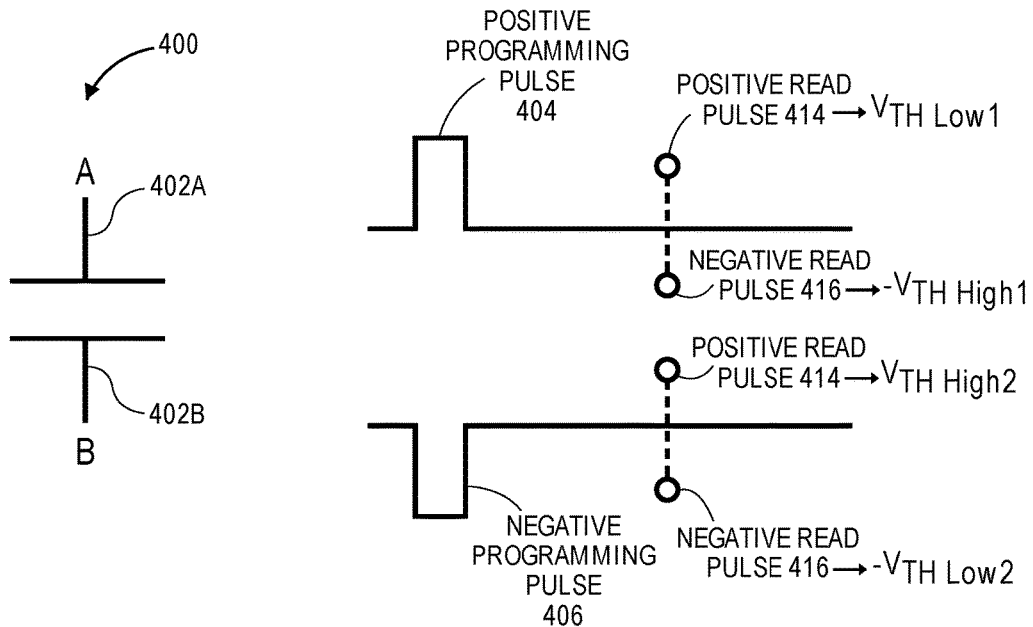
FIG. 4A is a diagram that illustrates the effect of performing a single-polarity read with different polarities, in accordance with an embodiment.
FIG. 4B is a table illustrating the effect of performing the single-polarity read illustrated in FIG. 4A, in accordance with an embodiment.

FIGS. 4A and 4B illustrate the effect of single-polarity reads with different polarities. FIG. 4A is a diagram illustrating a single-polarity read with either a positive or negative voltage, in accordance with an embodiment. Similar to FIG. 3A, FIG. 4A shows a memory cell 400 with two terminals 402A, 402B. Also similar to FIG. 3A, FIG. 4A illustrates a positive programming pulse 404 and a negative programming pulse 406. FIG. 4A differs from FIG. 3A in that it shows the effects of positive and negative reads following positive and negative programming pulses, in accordance with an embodiment. Specifically, FIG. 4A shows positive read pulses 414 and negative read pulses 416. Note that although the read pulses 414, 416 are illustrated without a specific pulse shape, the pulses can be any suitable pulse shape, such as the pulse shapes discussed above with respect to FIG. 3A. Also note that FIG. 3A and the following description are regarding a single-polarity pulse (either positive read pulses or negative read pulses, but not both positive and negative pulses for a given read).

In one embodiment, when the applied voltage and the programming voltage have the same polarity, the magnitude of the threshold voltage is low. For example, in the embodiment illustrated in FIG. 4A, the positive programming pulse 404 followed by the positive read pulse 414 results in $V_{TH\ Low1}$. Similarly, the negative programming pulse 406 followed by the negative read pulse 416 results in $-V_{TH\ Low2}$. In one embodiment, when the applied voltage and the programming voltage have different polarities, the magnitude of the threshold voltage is high. For example, in the embodiment illustrated in FIG. 4A, the positive programming pulse 404 followed by the negative read pulse 416 results in $-V_{TH\ High1}$. The negative programming pulse 406 followed by positive read pulse 414 results in $V_{TH\ High2}$.

According to an embodiment, the magnitudes of higher and lower threshold voltages can vary. For example, in the embodiment illustrated in FIG. 4A, $V_{TH\ High\ 1}$ can be different than $V_{TH\ High\ 2}$. For example, in one embodiment, memory cells exhibit different high threshold voltage magnitudes that differ based on the polarity of the programming and read pulses. Specifically, the higher threshold voltage magnitude exhibited by a given memory cell when read with a negative voltage (e.g., the negative read pulse 416) is not necessarily the same as a higher threshold voltage magnitude exhibited by the cell when read with a positive voltage (e.g., the positive read pulse 414). Similarly, in one embodiment, memory cells exhibit different lower threshold voltage magnitudes that differ based on the polarity of the programming and read pulses. Specifically, the lower threshold voltage magnitude exhibited by a given memory cell when read with a positive voltage (e.g., the positive read pulse 414) is not necessarily the same as a lower threshold voltage magnitude exhibited by the cell when read with a negative voltage (e.g., the negative read pulse 416).

In another embodiment, the high threshold voltage magnitudes are substantially the same regardless of the polarity of the programming and read pulses. Similarly, in one embodiment, the low threshold voltage magnitudes are substantially the same regardless of the polarity of the programming and read pulses. As is discussed below, high and low threshold voltage magnitudes can also vary from memory cell to memory cell when read with the same polarity. For example, memory cells located at different locations on a wafer can have different low and high threshold voltages. Thus, according to embodiments, variations can exist in the magnitude of higher or lower threshold voltages due to, for example, read polarity and memory cell variations. In one embodiment, regardless of variations in high and low threshold voltages (e.g., due to programming/read polarity or memory cell variations), a given memory cell exhibits a high threshold voltage and a low threshold voltage, where the magnitude of the high threshold voltage is greater than the magnitude of the low threshold voltage.

FIG. 4B is a table illustrating outcomes of the single polarity reads illustrated in FIG. 4A, in accordance with an embodiment. The table of FIG. 4B shows how, in accordance with the embodiment illustrated in FIG. 4A, the read output from a memory cell is a function of the read and write polarities. Column 421 is the programming polarity applied to the terminals 402A, 402B of the memory cell 500. In the table of FIG. 4B, $V_A$ refers to the voltage applied to terminal A (402A) and $V_B$ refers to the voltage applied to terminal B (402B). Thus, row 426 shows a case in which the programming polarity relative to terminal 402A is positive ($V_A > V_B$). Row 428 shows a case in which the programming polarity relative to terminal 402A is negative ($V_B > V_A$).

Column 422 shows the threshold voltage when the polarity of the read voltage pulse is positive, and column 424 shows the threshold voltage when the polarity of the read voltage pulse is negative, in accordance with an embodiment. As explained above, when the polarity of the programming and read pulses is the same, the magnitude of the output voltage is low (e.g., $|V_{TH\ Low1}|$ or $|-V_{TH\ Low2}|$), in accordance with an embodiment. When the polarity of the programming and read pulses is different, the magnitude of the output voltage is high (e.g., $|-V_{TH\ High1}|$ or $|V_{TH\ High2}|$), in accordance with an embodiment. For example, in one embodiment where the higher threshold voltage has a magnitude of 5.7V and the lower threshold voltage has a magnitude of 4.7V, a positive programming pulse followed by a positive read pulse results in a threshold voltage of 4.7V. A positive programming pulse followed by a negative read pulse results in −5.7V. A negative programming pulse followed by a positive read pulse results in a threshold voltage of 5.7V. A negative programming pulse followed by a negative read pulse results in a threshold voltage of −4.7V. Thus, the magnitude and the sign of the output of a read depends upon the polarity of the programming voltage and the polarity of the read voltage, in accordance with an embodiment.

Figure 4C:
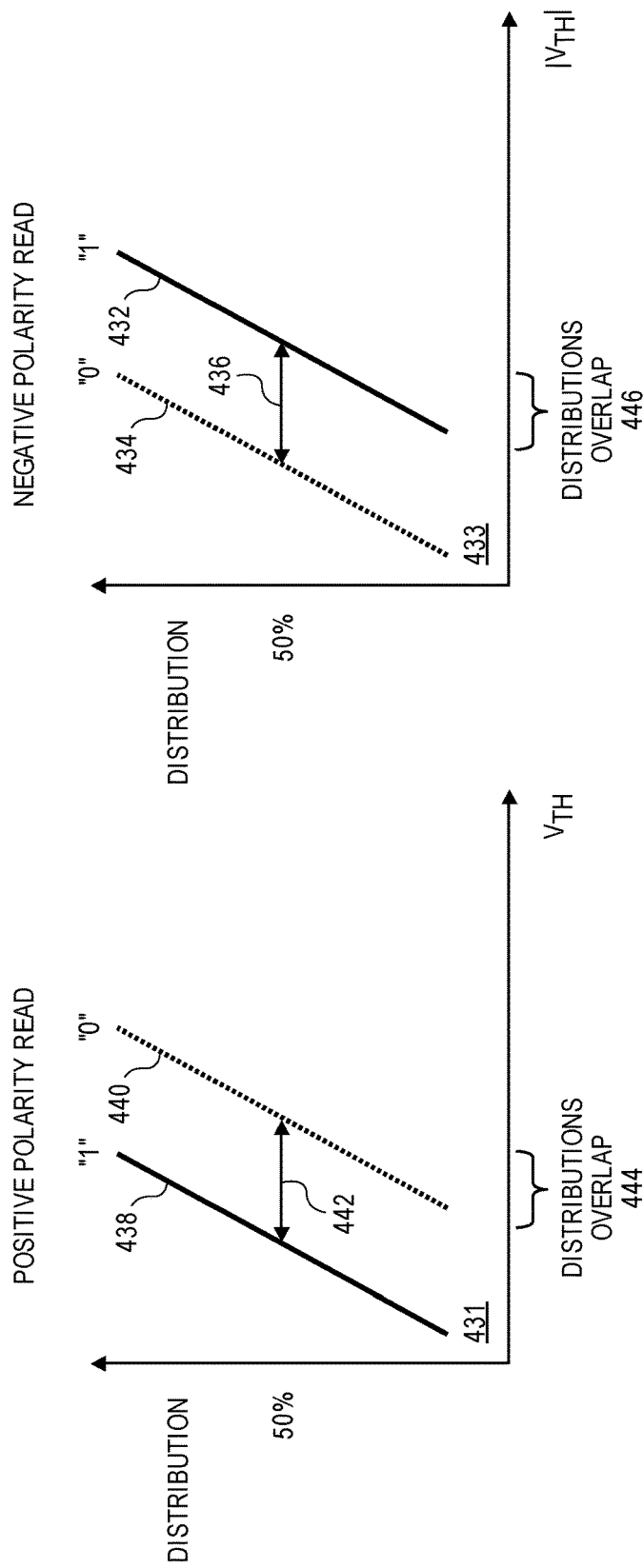
FIG. 4C includes graphs illustrating distributions of threshold voltages exhibited by a plurality of memory cells, in accordance with an embodiment.

FIG. 4C includes graphs that show the ranges of threshold voltage magnitudes as distributions, in accordance with an embodiment. The graph 431 illustrates the distribution of threshold voltage magnitudes in response to a positive polarity read, in accordance with an embodiment. The graph 433 illustrates the distribution of threshold voltage magnitudes in response to a negative polarity read, in accordance with an embodiment. In the embodiment illustrated in FIG. 4C, the distributions of threshold voltage magnitudes ($|V_{TH}|$) are normal (e.g., Gaussian). For illustrative purposes, FIG. 4C adopts a particular programming convention that assumes access circuitry applies a positive programming pulse to program a cell to a logic 1, and a negative programming pulse to program the cell to a logic 0. However, another embodiment can adopt the opposite programming convention (e.g., a positive programming pulse can result in a logic 0 and a negative programming pulse can result in a logic 1).

Referring to the graph 431, the line 438 shows a distribution of threshold voltage magnitudes exhibited by memory cells programmed with a logic 1 when read with a positive voltage pulse. Thus, under the programming convention illustrated in FIG. 4C, the line 438 shows a distribution of threshold voltage magnitudes exhibited by a memory cell that is programmed and read with voltage pulses having the same polarity. The line 438 therefore illustrates a distribution of lower threshold voltage magnitudes. The line 440 shows a distribution of threshold voltage magnitudes exhibited by memory cells programmed with a logic 0 and read with a positive voltage pulse. Thus, under the programming convention illustrated in FIG. 4C, the line 440 shows a distribution of threshold voltage magnitudes exhibited by a memory cell that is programmed and read with voltage pulses having different polarities (e.g., programmed with a negative voltage pulse and read with a positive voltage pulse). The line 440 therefore illustrates a distribution of higher threshold voltage magnitudes, in accordance with an embodiment.

Referring to graph 433, the line 434 shows a distribution of threshold voltages exhibited by memory cells programmed with a logic 0 when read with a negative voltage pulse, in accordance with an embodiment. Thus, under the programming convention illustrated in FIG. 4C, the line 434 shows a distribution of threshold voltages exhibited by a memory cell that is programmed and read with voltage pulses having the same polarity. The line 434 therefore illustrates a distribution of lower threshold voltages, in accordance with an embodiment. The line 432 shows a distribution of threshold voltages exhibited by memory cells programmed with a logic 1 when read with a negative voltage pulse. Thus, under the programming convention illustrated in FIG. 4C, the line 432 shows a distribution of threshold voltage magnitudes exhibited by a memory cell that is programmed and read with voltage pulses having different polarities (e.g., programmed with a positive voltage pulse and read with a negative voltage pulse). The line 432 therefore illustrates a distribution of higher threshold voltage magnitudes, in accordance with an embodiment.

As mentioned above with respect to FIG. 3B, in accordance with an embodiment, the distributions of higher and lower threshold voltages are separated by a window. For example, graph 431 shows that at the $50^{th}$ percentile the distribution 438 and the distribution 440 are separated by a window 442. Similarly, graph 433 shows that at the $50^{th}$ percentile the distribution 434 and the distribution 432 are separated by a window 436. In embodiments, the windows 442 and 436 can be the same or different depending on the relative distributions. The graphs 431 and 433 also show that the distributions of lower threshold voltage magnitudes and higher threshold voltage magnitudes can overlap, especially at the tails of the distributions, in accordance with an embodiment. For example, the graph 431 shows a range 444 of threshold voltage magnitudes in which the distributions 438 and 440 overlap. Similarly, the graph 433 shows a range 446 of threshold voltage magnitudes in which the distributions 432 and 434 overlap. The overlap 444, 446 can occur due to, for example, local variations of material composition or dimensions of the individual memory cells. Therefore, when performing a single-polarity read, access circuitry that attempts to read a memory cell that falls within the ranges 444, 446 of overlap can mistakenly read a cell that is a logic 1 as a logic 0, or vice versa. In some cases, error correction mechanisms can detect or correct such errors. However, if the distribution overlap is significant, then it may be impractical to rely on error correction mechanisms to handle the errors.

Figure 5A:
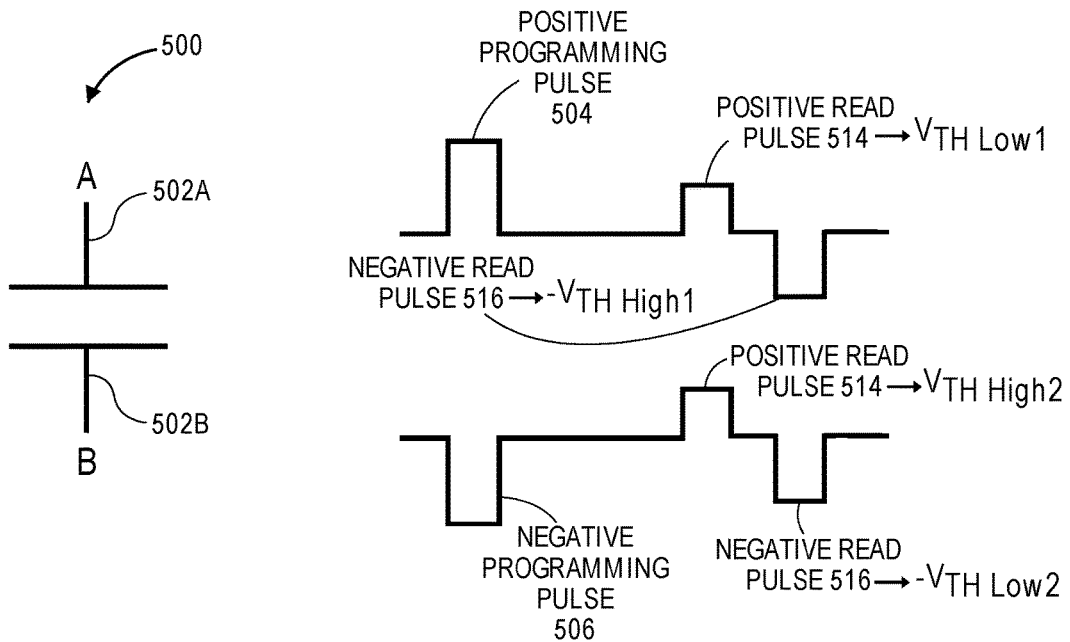
FIGS. 5A and 5B are diagrams illustrating a double-polarity read of a memory cell, in accordance with an embodiment.
Figure 5B:
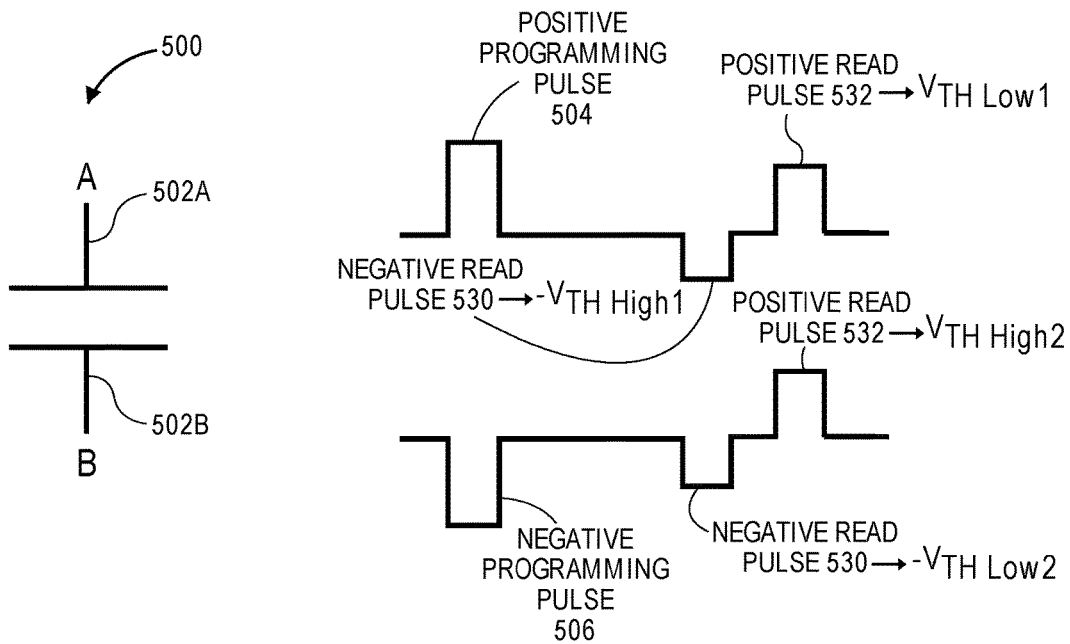

In one embodiment, a double-polarity read sequence enables correctly reading values stored in memory cells even when the threshold voltage distributions overlap, in accordance with an embodiment. FIGS. 5A and 5B are diagrams illustrating a double-polarity read of a memory cell, in accordance with an embodiment. Similar to FIG. 3A, FIGS. 5A and 5B show a memory cell 500 with two terminals 502A, 502B. Also similar to FIG. 3A, FIGS. 5A and 5B illustrate a positive programming pulse 504 and a negative programming pulse 506. However, in contrast to FIG. 3A, FIGS. 5A and 5B show a double-polarity read instead of a single-polarity read. In one embodiment, a double-polarity read sequence involves a voltage pulse at a positive polarity and a voltage pulse at a negative polarity.

As mentioned above, in one embodiment, when the applied voltage and the programming voltage have same polarity, the magnitude of the threshold voltage is low. For example, in the embodiment illustrated in FIG. 5A, positive programming pulse 504 followed by positive read pulse 514 results in $V_{TH\ Low1}$. Similarly, the negative programming pulse 506 followed by the negative read pulse 516 results in $-V_{TH\ Low2}$. In one embodiment, when the applied voltage and the programming voltage have different polarities, the magnitude of the threshold voltage is high. For example, in the embodiment illustrated in FIG. 5A, positive programming pulse 504 followed by negative read pulse 516 results in $-V_{TH\ High1}$. Negative programming pulse 506 followed by positive read pulse 514 results in $V_{TH\ High2}$. In one embodiment, the magnitude of a first read pulse is lower than the magnitude of the second read pulse. For example, in the example illustrated in FIG. 5A, the positive read pulses 514, 514 have a magnitude that is lower than the negative read pulses 516.

As discussed below, access circuitry can determine the logic state of memory cells based on the electrical responses of the memory cells to the application of both a positive polarity read voltage and a negative polarity read voltage. In accordance with embodiments, applying the read pulse 514 with a suitable magnitude enables access circuitry to determine whether the programming voltage was positive (e.g., corresponding to a logic "1" state), or inconclusive. In one such embodiment, if access circuitry determines the programming polarity is inconclusive based on the first (positive) read pulse 514, access circuitry can apply the second read pulse 516 to resolve the inconclusiveness. In one such embodiment, applying the second (negative) read pulse 516 with a suitable magnitude enables access circuitry to discriminate between memory cells that were programmed with a positive voltage (e.g., corresponding to a logic "1" state) and a negative voltage (e.g., corresponding to a logic "0" state). An example of a double-polarity method, including a description of how access circuitry can discriminate between memory cells programmed with positive and negative programming pulses, is described below with respect to FIGS. 6A-6H, 7A, and 7B. Additionally, selection of suitable magnitudes for the read pulses is discussed below with respect to FIG. 6B.

FIG. 5B is similar to FIG. 5A except that FIG. 5B shows a read sequence in which the first applied voltage in the read sequence is negative followed by a positive voltage. For example, FIG. 5B shows a negative read pulse 530 followed by a positive read pulse 532. FIG. 5B also shows a negative read pulse 530 followed by a positive read pulse 532. In one embodiment, the magnitude of a first read pulse is lower than the magnitude of the second read pulse. For example, in the example illustrated in FIG. 5B, the negative read pulses 530, 530 have a magnitude that is lower than the positive read pulses 532.

FIGS. 6A-6H and 7A-7B and the corresponding descriptions illustrate how access circuitry can read memory cells using a double-polarity read sequence such as the sequence shown in FIGS. 5A and 5B, in accordance with embodiments.

FIGS. 6A-6G are graphs illustrating distributions of threshold voltages exhibited by memory cells during performance of a double-polarity read, in accordance with an embodiment.

Figure 6A:
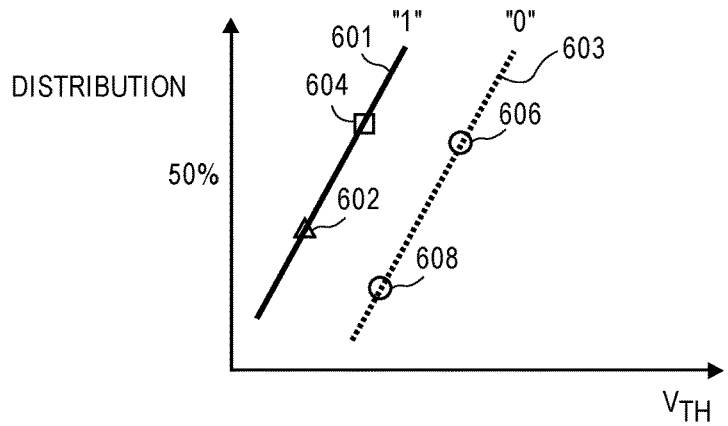

Referring to FIG. 6A, the graph illustrates distributions 601, 603 of threshold voltages exhibited by memory cells programmed with logic 1 and logic 0 respectively. In the embodiment illustrated in FIG. 6A, the distribution 601 is for memory cells programmed and read with a positive polarity. The distribution 603 is for memory cells programmed with a negative polarity and read with a positive polarity. Thus, points 602 and 604 are threshold voltages for two different memory cells programmed to logic 1 with a positive voltage and read with a positive voltage. Points 606 and 608 are threshold voltages for two other memory cells programmed to logic 0 with a negative voltage and read with a positive voltage.

Figure 6B:
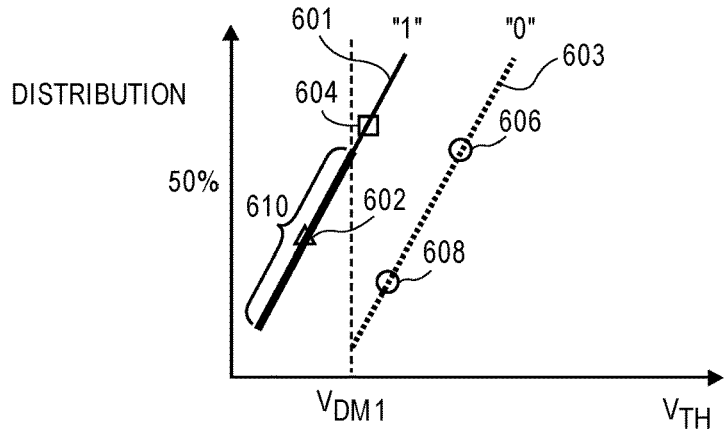

FIG. 6B illustrates application of a first voltage ($V_{DM1}$) in a double-polarity read sequence. In the illustrated embodiment, the first voltage has a positive polarity, and is thus "coherent" with the memory cells programmed to logic 1 with a positive voltage. In one embodiment, the magnitude of $V_{DM1}$ is selected to be lower than an expected lowest threshold voltage magnitude of cells programmed to the "0" logic state, e.g., lower than the lowest threshold voltage of cells in distribution 603. In one embodiment, the memory cells exhibit electrical responses to the first voltage. For example, in one embodiment, the memory cells can either threshold or not threshold in response to $V_{DM1}$. In one embodiment, whether or not a given memory cell thresholds in response to $V_{DM1}$ depends on, for example, whether the memory cell is programmed to a logic 1 or logic 0, and whether or not the memory cell exhibits threshold voltages in the range of overlap between the distributions. In one embodiment, a memory cell thresholds in response to an applied voltage if the applied voltage has a magnitude that is greater than the exhibited threshold voltage. Specifically, in reference to the FIG. 6B, the plurality of memory cells can be grouped based on their response to the first voltage, including: memory cells that are programmed with a logic 1 that threshold in response to the first voltage (e.g., the memory cell corresponding to data point 602); memory cells that are programmed with a logic 0 that do not threshold in response to the first voltage (e.g., the memory cells corresponding to the points 606 and 608); and memory cells that are programmed with a logic 1, but that do not threshold in response to the first voltage (e.g., the memory cell corresponding to point 604), for example cells that exhibit a threshold voltage that falls within the overlap of distributions.

In one such embodiment, $V_{DM1}$ has a polarity and magnitude to correctly identify the logic 1 memory cells that threshold in response to the $V_{DM1}$. For example, the magnitude of $V_{DM1}$ is high enough to cause the memory cell corresponding to point 602 to threshold, and thus enable access circuitry to correctly read a logic 1. As illustrated, $V_{DM1}$ is also high enough to cause memory cells falling in the range 610 of the distribution (e.g., the lower part of the distribution 601) to threshold, and thus enable access circuitry to read those memory cells as a logic 1. In addition to correctly ascertaining that the memory cells in the range 610 are logic 1, in one embodiment, application of $V_{DM1}$ also refreshes or reinforces the data stored in the memory cells that threshold. In one such embodiment, the memory cells in the range 610 get reinforced in response to the first voltage because those memory cells experience a threshold event, and therefore the application of the first voltage has a programming effect. In one such example, the read polarity is coherent with program polarity of cells that threshold, so the read pulse and corresponding threshold event has the same effect as a write pulse that programs the same logic state already stored in the memory cell. Thus, in one embodiment, application of the $V_{DM1}$ refreshes the memory cells that threshold in response to the first voltage, which can prevent drift of the thresholding memory cells' state.

In one embodiment, memory cells that do not threshold in response to the first voltage could be either memory cells programmed to logic 0, or memory cells programmed to a logic 1 that exhibit a threshold voltage with a magnitude higher than $V_{DM1}$ (e.g., memory cells that exhibit a threshold voltage magnitude that falls within the overlap of distributions). In the illustrated example, $V_{DM1}$ has a magnitude that is lower than the magnitudes of threshold voltages of distribution 603 (e.g., a magnitude that is lower than an expected lowest magnitude of the range defined by line 603). Therefore, in the illustrated embodiment, the memory cells programmed to logic 0 (including the memory cells corresponding to the data points 606 and 608) do not threshold in response to $V_{DM1}$. Additionally, in one embodiment, a memory cell that is programmed to logic 1, but that exhibits a threshold voltage that is on the high tail of the distribution 601 (e.g., the memory cell corresponding to point 604) may not threshold in response to $V_{DM1}$. Therefore, in a system performing a single-polarity read, the memory cell corresponding to point 604 would likely be read incorrectly as a logic 0. However, in contrast to a single-polarity approach, in accordance with an embodiment, access circuitry determines that the logic state of the non-thresholding memory cells is inconclusive in response to $V_{DM1}$ alone. Instead, in one embodiment, access circuitry determines the logic state of such memory cells based on a read sequence (e.g., the memory cells responses to both $V_{DM1}$ and a second applied voltage), as discussed further below.

Figure 6C:
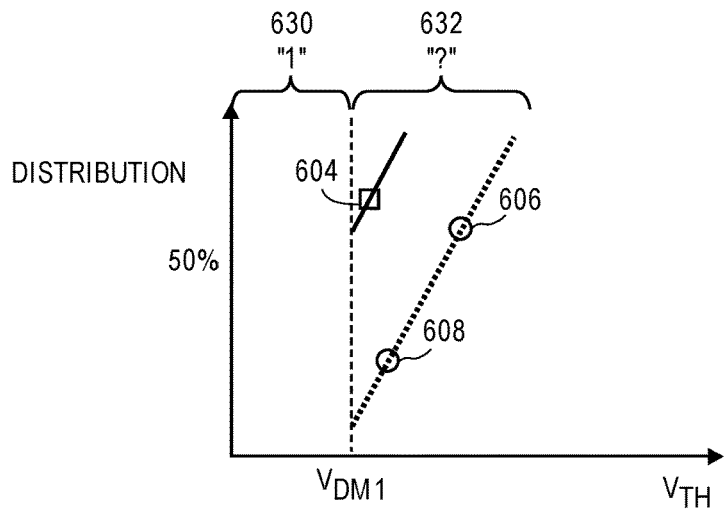

FIG. 6C shows the outcome of $V_{DM1}$ in the double-polarity read sequence, in accordance with an embodiment. In one embodiment, after applying $V_{DM1}$, access circuitry is to determine whether a given memory cell of the array is in a first logic state (e.g., logic 1 in the illustrated example) or whether the given memory cell's logic state is inconclusive based on the electrical responses to $V_{DM1}$. Thus, access circuitry determines that the memory cells that threshold in response to $V_{DM1}$ (e.g., memory cells in the range 630) are logic 1, in accordance with an embodiment. The access circuitry determines that memory cells that do not threshold in response to $V_{DM1}$ (e.g., memory cells in the range 632) could be either a logic 1 or logic 0, and thus have a logic state that is inconclusive. Therefore, in one embodiment, the access circuitry is to apply a second voltage with a second polarity to discriminate between the memory cells that are actually logic 0, and those that are logic 1 (e.g., logic 1 cells in the high tail of the distribution).

Figure 6D:
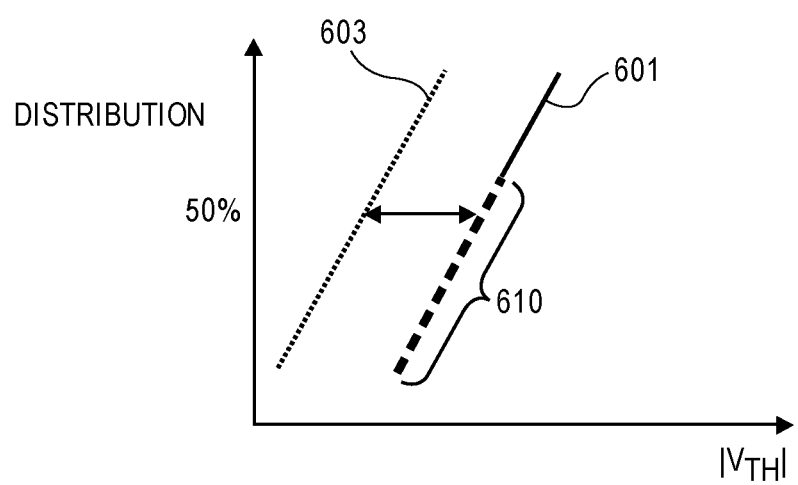

The second voltage of the double-polarity read sequence has a different polarity than $V_{DM1}$, and thus causes the distributions of threshold voltage magnitudes to revert, as shown in FIG. 6D. FIG. 6D illustrates the distributions of threshold voltages in response to a negative read pulse. As mentioned above with respect to FIGS. 5A and 5B, the negative polarity read pulses results in negative threshold voltages, in accordance with an embodiment. However, for ease of comparison with the previous FIGS. 6A-6C, the x-axis of FIG. 6D shows the absolute value of the threshold voltages. Unlike the distributions in FIG. 6A, the distribution 603 of threshold voltage magnitudes for logic 0 memory cells is lower than the distribution 601 of threshold voltage magnitudes for logic 1 memory cells. As discussed above, if a memory cell is programmed and read with the same polarity, it exhibits a threshold voltage having a magnitude in the lower distribution, in accordance with an embodiment. Thus, the memory cells programmed to logic 0 with a negative voltage and then read with a negative voltage exhibit a threshold voltage having a magnitude falling in the lower range, in accordance with an embodiment. The memory cells programmed to logic 1 with a positive voltage and then read with a negative voltage exhibit a threshold voltage having a magnitude in the higher range. As discussed above, in one embodiment, access circuitry can determine that the memory cells in the range 610 are a logic 1 in response to the first voltage. Therefore, because the access circuitry already determined the logic state of the memory cells in the range 610, the access circuitry can mask (e.g., screen) those memory cells from the second voltage. If access circuitry masks the memory cell from a voltage, the access circuitry does not apply the voltage to that memory cell.

Figure 6E:
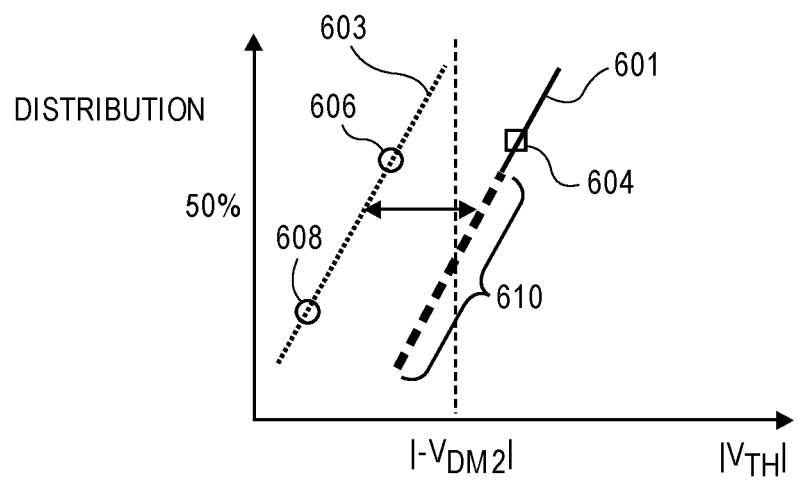

Referring to FIG. 6E, the graph shows a second voltage ($-V_{DM2}$) with a polarity that is different than the first voltage, in accordance with an embodiment. In the embodiment illustrated in FIG. 6E, $V_{DM2}$ has a negative polarity (e.g., $-V_{DM2}$) that is coherent with the polarity used to program memory cells to logic 0. Therefore, the memory cells programmed to logic 0 with the negative polarity exhibit a threshold voltage having a magnitude that is in the lower distribution in response to $-V_{DM2}$. In one embodiment, $-V_{DM2}$ has a magnitude ($|-V_{DM2}|$) that is sufficiently high to cause the memory cells programmed to logic 0 to threshold. For example, in one embodiment, the access circuitry is to apply the second voltage having a magnitude that is higher than the expected highest magnitude of the distribution 603. In the example illustrated in FIG. 6E, the memory cells in the distribution 603 (including the memory cells corresponding to points 606 and 608) threshold in response to $-V_{DM2}$. Therefore, access circuitry can determine that the memory cells that threshold in response to $-V_{DM2}$ are logic 0, in accordance with an embodiment. Additionally, in one embodiment, application of $-V_{DM2}$ also refreshes or reinforces the data stored in the logic 0 memory cells. In one such embodiment, the memory cells in the distribution 603 get reinforced in response to $-V_{DM2}$ because those memory cells experience a threshold event, and therefore the application of $-V_{DM2}$ has a programming effect. Similar to the example described above with respect to FIG. 6B, the read polarity is coherent with the programming polarity of cells that threshold, so the read pulse and corresponding threshold event has the same effect as a write pulse that programs the same logic state already stored in the memory cell. Thus, in one embodiment, application of $-V_{DM2}$ refreshes the memory cells that threshold in response to $V_{DM2}$, which can prevent drift of the thresholding memory cells' state.

In one embodiment, memory cells programmed to logic 1 that did not threshold in response to $V_{DM1}$ (e.g., the memory cell corresponding to point 604) also do not threshold in response $-V_{DM2}$. Thus, based on the electrical response to both $V_{DM1}$ and $-V_{DM2}$, the access circuitry can accurately read the memory cells that were considered to be of indeterminate state after the application of $V_{DM1}$. For example, memory cells that did not threshold in response to $V_{DM1}$ or $-V_{DM2}$ are read as logic 1, in accordance with an embodiment. Memory cells that did not threshold in response to $V_{DM1}$, but do threshold in response to $-V_{DM2}$, are logic 0, in accordance with an embodiment.

As indicated above, the access circuitry can mask the memory cells that were determined to be logic 1 from $-V_{DM2}$. For example, referring to FIG. 6E, access circuitry can mask the memory cells falling in range 610 of the distribution. In one embodiment, because access circuitry already determined the value of those memory cells, application of $-V_{DM2}$ is unnecessary. Furthermore, masking the cells already determined to be logic 1 prevents those memory cells from thresholding in response to $-V_{DM2}$, and therefore prevents those memory cells from changing state. For example, in one embodiment in which the access circuitry does not mask memory cells (such as the memory cells in range 610) from $-V_{DM2}$, some or all of those memory cells may threshold in response to the application of $-V_{DM2}$. In one such embodiment, because the polarity of $-V_{DM2}$ is different than the polarity used to program the memory cells in the range 610, the application of $-V_{DM2}$ would cause those memory cells to change from a logic 1 to a logic 0. Accordingly, in one embodiment, if access circuitry does not mask the memory cells in the range 610 from the application of $-V_{DM2}$, the access circuitry reprograms those memory cells to their prior logic state (e.g., a logic 1 in the illustrated example) after the application of $-V_{DM2}$. In an embodiment in which those memory cells are masked, the access circuitry does not need to reprogram the memory cells. Thus, in one embodiment, a majority of memory cells (but typically not all memory cells) are refreshed by the first and second read pulses (e.g., $V_{DM1}$ and $-V_{DM2}$).

In one embodiment, a complete refresh of memory cells can involve reprogramming any memory cells that did not threshold in response to the first and second read pulses. For example, referring again to FIG. 6E, the memory cell corresponding to point 604 does not threshold in response to $V_{DM1}$ and $-V_{DM2}$, and therefore is not refreshed by the read sequence, in accordance with embodiments. In one such embodiment, access logic can refresh the memory cell corresponding to point 604 (and other memory cells that did not refresh when read with $V_{DM1}$ and $-V_{DM2}$) with a programming pulse, such as the programming pulses described above with respect to FIG. 3A. Thus, in one such embodiment, a complete refresh can be achieved mostly as a side effect of reading the memory cells, and selectively applying programming pulses to refresh memory cells that were not refreshed by the read sequence.

FIGS. 6F and 6G are graphs illustrating both the first and second read voltages described above with respect to FIGS. 6A-6E, in accordance with an embodiment. Note that the graphs 620G and 622G of FIG. 6G show the absolute value of the threshold voltage ($|V_{TH}|$). The graphs 620F and 622F do not show the absolute value, but instead show the sign of the threshold voltage ($V_{TH}$). FIG. 6H is a chart summarizing the double-polarity read in accordance with the embodiments of FIGS. 6A-6G.

Referring to FIG. 6F, graph 620F shows application of a first voltage ($V_{DM1}$) at a first polarity, in accordance with an embodiment. Graph 620F shows the four data points 602, 604, 606, 608 discussed above, which correspond to memory cells. Data points 602 and 604 represent memory cells that are programmed to logic 1 and data points 606 and 608 represent memory cells that are programmed to logic 0.

In response to the first voltage, some memory cells threshold and some memory cells do not threshold. For example, memory cells in the range 610 (including the memory cell corresponding to data point 602) threshold in response to $V_{DM1}$. Memory cells in the distribution 603 (including the memory cells corresponding to points 606 and 608) and memory cells in the high tail of distribution 601 (including the memory cell corresponding to point 604) do not threshold in response to $V_{DM1}$. Access circuitry can determine that the memory cells that threshold in response to $V_{DM1}$ are logic 1, while the memory cells that do not threshold in response to $V_{DM1}$ are of an indeterminate state.

Therefore, in one embodiment, access circuitry applies a second voltage (e.g., $-V_{DM2}$) to at least the memory cells of indeterminate state to distinguish between the logic 1 and logic 0 memory cells. Referring again to FIG. 6F, the graph 622F illustrates a second voltage ($-V_{DM2}$) with a second polarity, in accordance with an embodiment. Graph 622F also shows the four data points 602, 604, 606, 608 corresponding to memory cells relative to $-V_{DM2}$. In response to the application of $-V_{DM2}$, some memory cells threshold and some memory cells do not threshold. For example, memory cells in the range 612 (including the memory cells corresponding to points 606 and 608) threshold in response to $-V_{DM2}$. Memory cells in the range 614 (including the memory cell corresponding to point 604) do not threshold in response to $-V_{DM2}$. The range 611 points to a range of memory cells that would also not threshold in response to $-V_{DM2}$ if access circuitry were to apply $-V_{DM2}$ to those memory cells (instead of screening those memory cells). In one embodiment, the range 611 corresponds to the margin available for setting the magnitude of $-V_{DM2}$. For example, in one embodiment, $-V_{DM2}$ has a magnitude that is higher than the highest expected threshold voltage magnitude exhibited by logic 0 memory cells when read with the same polarity used to program logic 0 memory cells (e.g., higher than the distribution 603). In one such embodiment, $-V_{DM2}$ has a magnitude that is lower than the lowest expected threshold voltage magnitude exhibited by the logic 1 memory cells that did not threshold in response to $V_{DM1}$ (e.g., lower than the memory cells in the range 614).

As mentioned above, FIG. 6G also shows the double-polarity read sequence described above with respect to FIG. 6F, but the x-axes of graphs 620G and 622G are in terms of the absolute value of the threshold voltage ($|V_{TH}|$). Note that although FIG. 6F illustrates $V_{DM1}$ as positive and $V_{DM2}$ as negative, in other embodiments, $V_{DM1}$ is negative and $V_{DM2}$ is positive.

FIG. 6H is a chart summarizing the double-polarity read in accordance with the embodiments of FIGS. 6A-6G. The chart includes three rows 650, 651, 652 for memory cells programmed to logic 1 or logic 0. As shown in column 642, in one embodiment, a memory cell can be programmed to a logic 1 (row 650 and row 651) or a logic 0 (row 652). Thus, a "1" in column 642 refers to a memory cell that is programmed to a logic 1 (e.g., with a positive programming voltage), and a "0" in column 642 refers to a memory cell that is programmed to a logic 0 (e.g., with a negative programming voltage). The remaining columns of the table indicate whether or not the memory cell thresholds in response to the voltage pulses in a double-polarity read sequence (columns 644 and 646), and the logic value output of the read sequence (column 648).

Column 644 shows whether or not a memory cell thresholds in response to the application of $V_{DM1}$, in accordance with an embodiment. A "NO" in column 644 indicates that a memory cell does not threshold in response to $V_{DM1}$, and a "YES" in column 644 indicates that a memory cell does threshold in response to $V_{DM1}$. As can be seen in column 644, in one embodiment, memory cells programmed to logic 0 or logic 1 can have different responses to the application of $V_{DM1}$. For example, some memory cells programmed to logic 1 (row 650) threshold in response to the application of $V_{DM1}$ (as indicated by the "YES" in column 644, row 650). Other memory cells programmed to logic 1 (row 651) do not threshold in response to the application of $V_{DM1}$ (as indicated by the "NO" in column 644, row 651). In the embodiment illustrated in FIG. 6H, logic 0 memory cells do not threshold in response to $V_{DM1}$ (as indicated by the "NO" in column 644, row 652). Thus, in one embodiment, access circuitry can determine that the memory cells that threshold in response to $V_{DM1}$ are logic 1, while the memory cells that do not threshold in response to $V_{DM1}$ are of an indeterminate state (e.g., could be logic 0 or logic 1). In contrast to a single-polarity read, which may incorrectly determine that a memory cell illustrated by row 651 is a logic 0, a double-polarity read sequence determines the logic state of the memory cell based further on a second voltage (e.g., $-V_{DM2}$).

Similarly, column 646 shows whether or not memory cells threshold in response to the application of $-V_{DM2}$. A "NO" in column 646 indicates that a memory cell does not threshold in response to $-V_{DM2}$, and a "YES" in column 646 indicates that a memory cell does threshold in response to −$V_{DM2}$. "SCREEN" in column 646 indicates that the memory cells can be screened from the application of −$V_{DM2}$.

For example, referring to column 646, row 650, logic 1 memory cells that thresholded in response to $V_{DM1}$ can be screened. As explained above, if the access circuitry does not screen those cells (e.g., if access circuitry applies −$V_{DM2}$ to the logic 1 memory cells that thresholded in response to $V_{DM1}$), some of those memory cells may threshold and some may not threshold in response to −$V_{DM2}$. For example, the logic 1 memory cells that exhibit a threshold voltage that is higher in magnitude than −$V_{DM2}$ do not threshold in response to −$V_{DM2}$, in accordance with an embodiment. The logic 1 memory cells that exhibit a threshold voltage that is equal to or lower in magnitude than −$V_{DM2}$ do threshold in response to −$V_{DM2}$, in accordance with an embodiment. Thus, in accordance with an embodiment, if such memory cells are not screened from −$V_{DM2}$, some of those cells may threshold in response to −$V_{DM2}$ and require reprogramming to their prior logic state. Column 646, row 651 shows that that the logic 1 memory cells that did not threshold in response to $V_{DM1}$ (such as the memory cell corresponding to point 606 in FIG. 6F) also do not threshold in respond to −$V_{DM2}$ (as indicated by the "NO" in column 646, row 651).

In contrast, column 646, row 652 shows that the logic 0 memory cells do threshold in response to −$V_{DM2}$ (as indicated by the "YES" in column 646, row 652). Thus, access circuitry can determine that the memory cells that threshold in response to −$V_{DM2}$ are logic 0, while the memory cells that fail to threshold in response to $V_{DM1}$ and −$V_{DM2}$ are determined to be logic 1. Column 648 shows the output of a double-polarity read sequence in accordance with an embodiment. The "output" refers to the logic state determined by access circuitry. Thus, a "1" in column 648 refers to a logic 1, and a "0" in column 648 refers to a logic 0. As shown by row 651, a double-polarity read can correctly determine the logic state of a memory cell that might otherwise be read incorrectly with a single-polarity read.

Figure 7A:
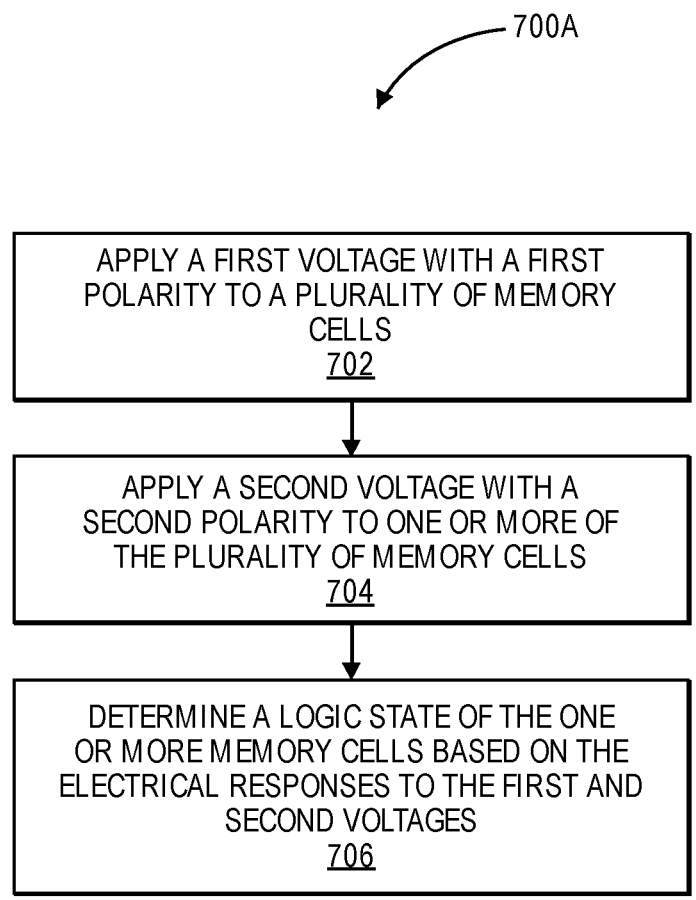
FIG. 7A is a flow diagram of a double-polarity read, in accordance with an embodiment.
Figure 7B:
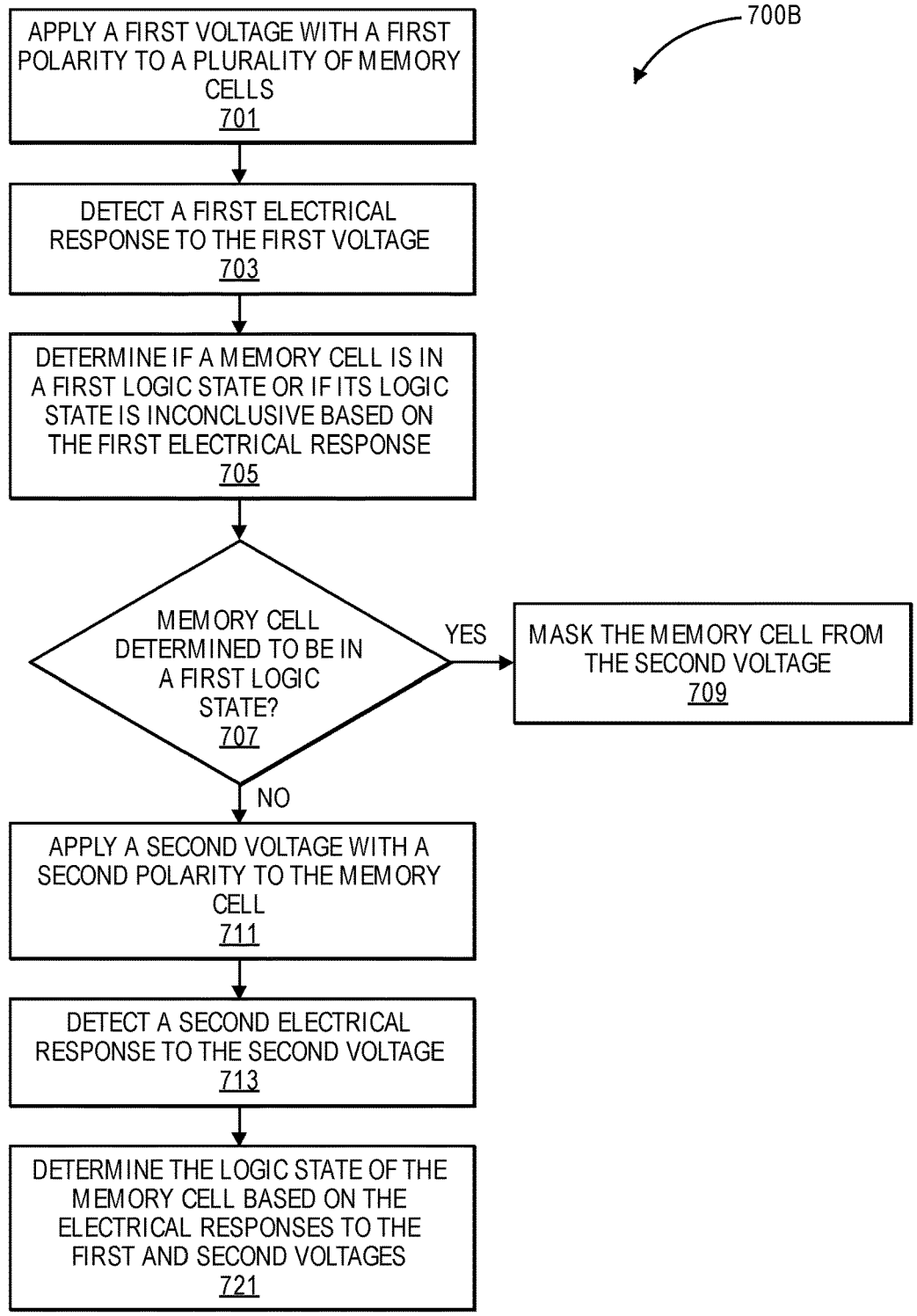
FIG. 7B is another flow diagram of a double-polarity read, in accordance with an embodiment.
Figure 11:
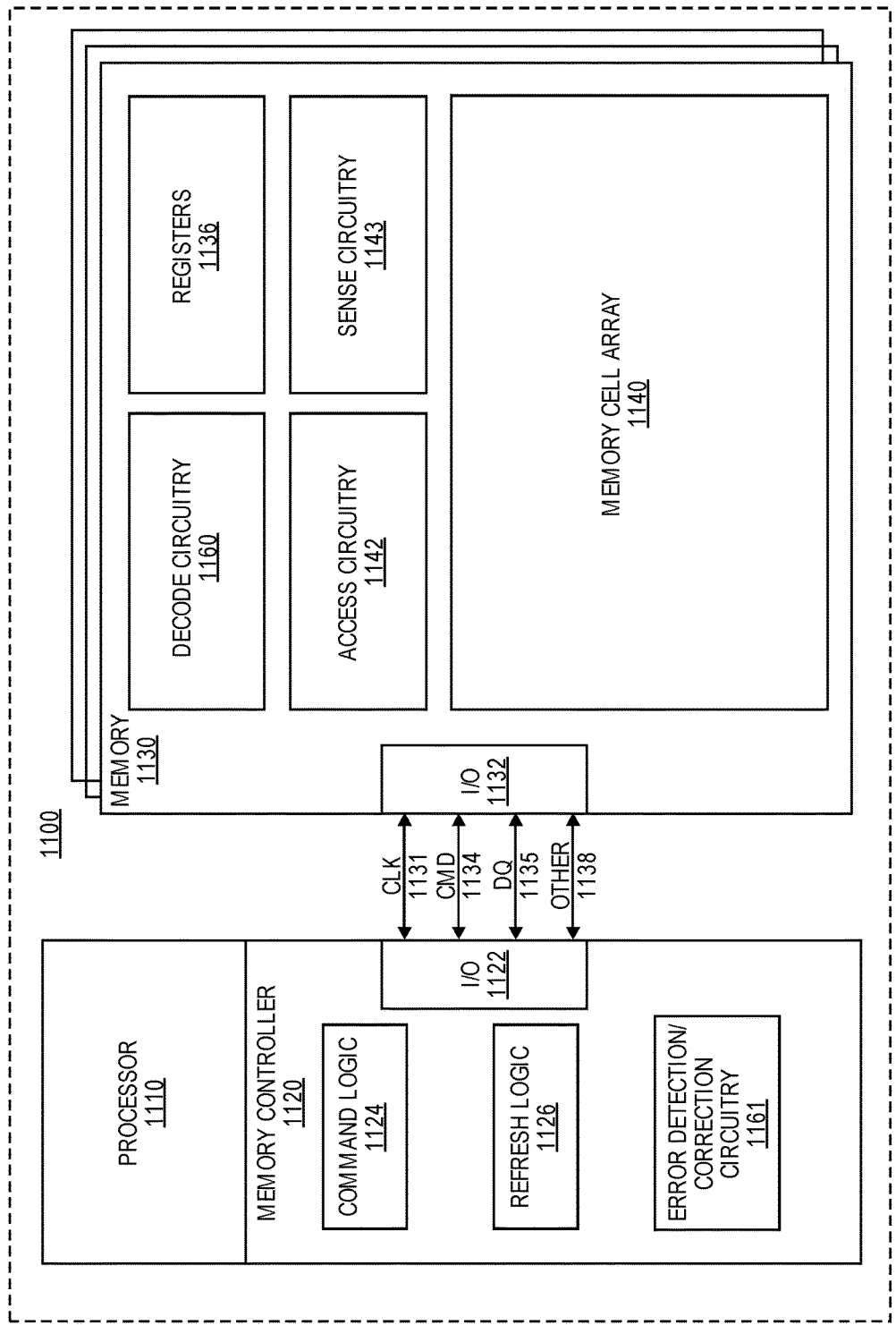
FIG. 11 is a system for performing a double-polarity read, in accordance with an embodiment.

FIGS. 7A and 7B are flow diagrams illustrating methods of performing a double-polarity read, in accordance with embodiments. The processes described with respect to FIGS. 7A and 7B can be performed by hardware logic and circuitry. An example of circuitry that can perform double-polarity reads is illustrated in FIG. 11. For example, the following processes are described as being performed by access circuitry and sense circuitry, such as the access circuitry 1142 and sense circuitry 1143 of FIG. 11. However, other embodiments can include different circuitry configurations suitable for performing the processes.

Referring to FIG. 7A, the method 700A is a method of performing a double-polarity read sequence, in accordance with an embodiment. Prior to reading the memory cells, access circuitry writes data to a plurality of memory cells. For example, access circuitry writes logic 0s and logic 1s to a plurality of memory cells such as the memory cell 100 of FIG. 1. In one embodiment, access circuitry can write logic 0s by applying programming pulses with a negative polarity and logic 1s by applying programming pulses with a positive polarity. The opposite convention can also be adopted.

After writing data to the plurality of memory cells, access circuitry can read the plurality of memory cells using a double-polarity read sequence. In one embodiment, a double-polarity read sequence involves applying a first voltage with a first polarity to the plurality of memory cells, at operation 702. The first voltage can be the same as or similar to the positive read pulse 514 of FIG. 5A or the negative read pulse 530 of FIG. 5B. FIG. 6F also shows an example of a first voltage ($V_{DM1}$) in the read sequence. In one embodiment, applying the first voltage involves applying a voltage pulse to terminals of the memory cell, such as the terminals 502A, 502B of FIG. 5A. As mentioned above, the shape of the voltage pulse can be box-shaped, ramped, or another suitable shape for causing the memory cell to exhibit a threshold voltage. The magnitude and duration of the first voltage pulse can be the same as described above with respect to FIG. 1, or another suitable magnitude and duration to cause the memory cells to exhibit electrical responses to enable reading the memory cells.

In contrast to conventional read techniques, the method 700A also involves applying a second voltage with a second polarity to one or more of the plurality of memory cells, at operation 704. The second voltage has a polarity that is different than the first voltage. The second voltage can be the same as or similar to the negative read pulse 516 of FIG. 5A or the positive read pulse 532 of FIG. 5B. FIG. 6F also shows an example of a second voltage −$V_{DM2}$. In FIG. 6F, $V_{DM1}$ has a positive polarity and −$V_{DM2}$ has a negative polarity. The duration of the second voltage pulse can be the same or similar to the first voltage pulse. In one embodiment, the magnitude of the second voltage is greater than the magnitude of the first voltage.

After applying the first and second voltages, access circuitry determines the logic state of the one or more memory cells based on the electrical responses to the first and second voltages, at operation 706. For example, if the electrical response to the first voltage includes the thresholding of a given memory cell, access circuitry determines that the given memory cell is programmed to a logic 1. In one such embodiment, if the electrical response to the first voltage includes an absence of a threshold event (e.g., the given memory cell does not threshold), the access circuitry determines the logic state of the given memory cell is inconclusive. In one embodiment, in the case of an inconclusive logic state determination, if the given cell thresholds in response to the second voltage, access circuitry determines that the memory cell is programmed to a logic 0. In one such embodiment, if the given memory cell does not threshold in response to the second voltage, the access circuitry determines that the given memory cell is programmed to a logic 1.

FIG. 7B is another flow diagram of a double-polarity read sequence, in accordance with an embodiment. Like the method 700A of FIG. 7A, the method 700B of FIG. 7B begins with applying a first voltage (e.g., $V_{DM1}$ of FIG. 6F or the read pulses 514 and 530 of FIGS. 5A and 5B) with a first polarity to a plurality of memory cells, at operation 701.

After applying the first voltage, sense circuitry detects a first electrical response of the plurality of memory cells to the first voltage, at operation 703. For example, in one embodiment, sense circuitry detects one of a voltage drop (e.g., a threshold voltage) across terminals of a given memory cell of the array, current through the given memory cell, and a threshold event of the given memory cell. In one embodiment, detecting a threshold voltage for a memory cell can include determining that the cell's threshold voltage is lower than or higher than a reference voltage, for example the first read voltage.

Based on the first electrical response, access circuitry can determine the logic state of some of the memory cells. For example, in one embodiment, access circuitry determines if a memory cell is in a first logic state (e.g., logic 1) or if the memory cell's logic state is inconclusive based on the first electrical response, at operation 705. In one embodiment, access circuitry determines that a memory cell is a logic 1 if the memory cell thresholds in response to the first voltage. In one embodiment in which the sense circuitry is to detect current through a given memory cell, the access circuitry is to determine the given memory cell is in the first logic state based on detection that the current is greater than or equal to a threshold current in response to the first voltage. In one embodiment, a threshold event switches the cell (e.g., the non-phase change chalcogenide self-selecting memory material) from a high resistivity to a low resistivity state, resulting in a current that is greater than or equal to a threshold current. In one embodiment, the threshold current is in the range of 1-10 μA (microamperes). However, other embodiments may have a threshold current that is lower than 1 μA or higher than 10 μA depending on, for example, the storage material's properties (e.g., conductivity of the storage material).

In one such embodiment, access circuitry determines that the memory cell's state is inconclusive if the memory cell does not threshold in response to the first voltage. In one embodiment in which the sense circuitry is to detect current through a given memory cell, the access circuitry determines the given memory cell's logic state is inconclusive if the current is less than a first threshold current in response to the first voltage. In one embodiment, access circuitry determines whether or not to apply a second voltage to the memory cells based on whether the memory cell's logic state is inconclusive based on the first voltage.

For example, if access circuitry determines that a memory cell is in the first logic state, 707 YES branch, access circuitry can mask the memory cell from a second voltage, at operation 709. If it is inconclusive as to whether the memory cell is in a first or second logic state, 707 NO branch, access circuitry applies a second voltage (e.g., $-V_{DM2}$ of FIG. 6F or the read pulses 516 or 532 of FIGS. 5A and 5B) with a second polarity to the memory cell, at operation 711.

After applying the second voltage, sense circuitry detects a second electrical response of the memory cell to the second voltage, at operation 713. Detecting a second electrical response can involve detecting the same or similar type of electrical responses described above with respect to operation 703.

Access circuitry can then determine the logic state of the memory cell based on the electrical responses to both the first and second voltages, at operation 721. For example, in an embodiment in which the sense circuitry detects current through a given memory cell, the access circuitry can determine that the given memory cell is at the first logic state (e.g., logic 1) if the current is less than a second threshold current in response to the second voltage. In one such embodiment, the access circuitry can determine that the given memory cell is at a second logic state (e.g., logic 0) if the current is greater than or equal to the second threshold current in response to the second voltage with the second polarity. In one embodiment, the second threshold current is substantially the same as the threshold current described above with respect to operation 705.

Figure 8A:
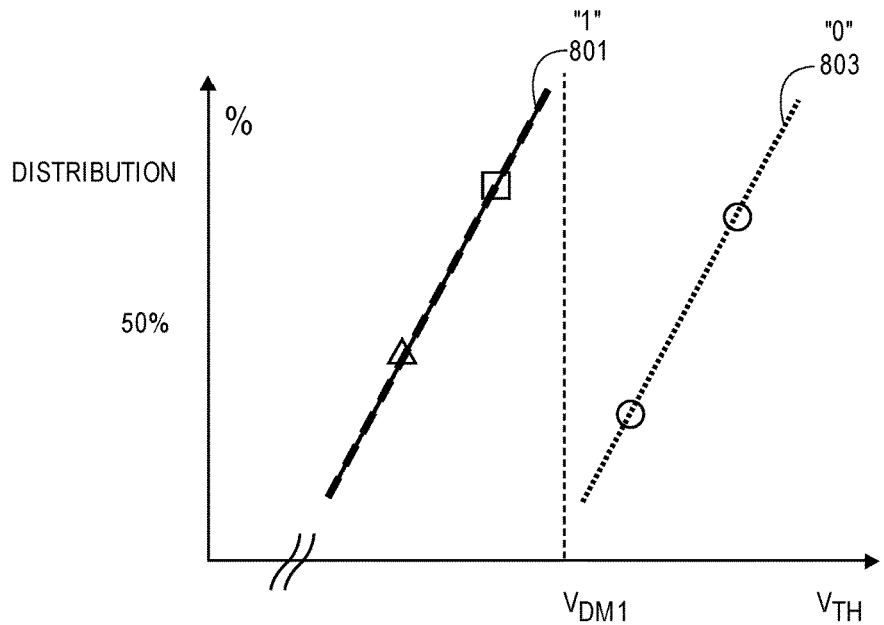
FIG. 8A is a graph illustrating a distribution of threshold voltages in which the lower and higher threshold voltage distributions do not overlap, in accordance with an embodiment.
Figure 8B:
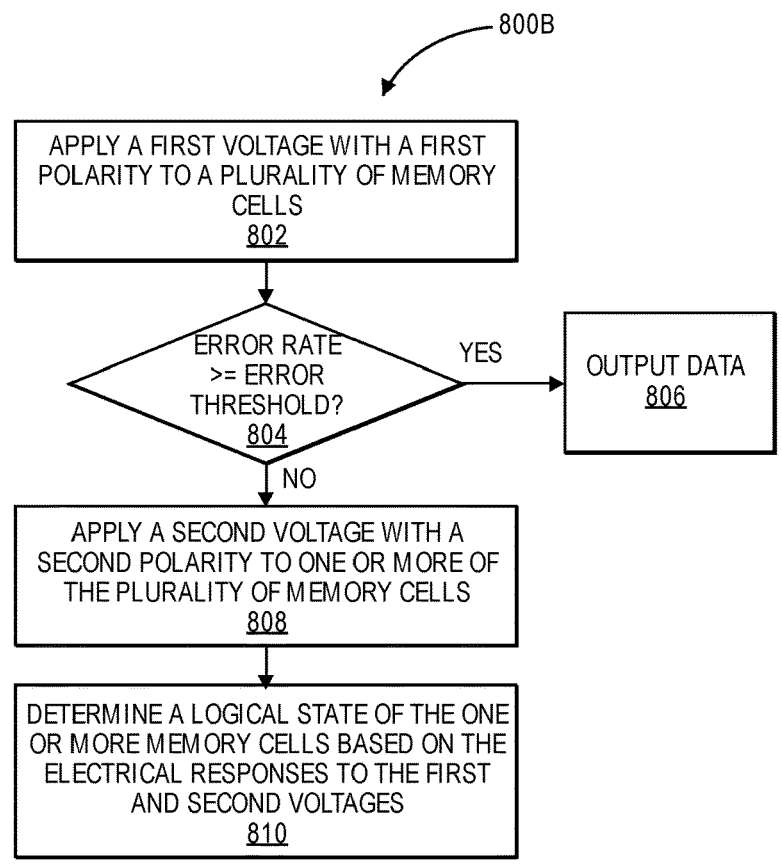
FIG. 8B illustrates a method of performing a double-polarity read in which the second voltage is conditioned upon the ability of an error correction code to detect errors, in accordance with an embodiment.

FIGS. 8A and 8B illustrate an embodiment in which the second voltage pulse of a double-polarity read sequence is conditional. FIG. 8A is a graph illustrating a distribution of threshold voltages in which the lower and higher threshold voltage distributions do not overlap, in accordance with an embodiment. A minimal (statistically insignificant) overlap of threshold voltage distributions may be present in some cases (not shown). FIG. 8B illustrates a method of performing a double-polarity read in which the second voltage is conditioned upon the ability of an error correction code to detect or correct errors, in accordance with an embodiment.

Referring to FIG. 8A, the graph includes a lower distribution 801 and a higher distribution 803 of threshold voltage magnitudes, similar to the graph of FIG. 6A. In the example illustrated in FIG. 8A, the distribution 801 is of threshold voltages exhibited by memory cells that are programmed to logic 1 with a positive voltage and read with a positive voltage. The distribution 803 is of threshold voltages exhibited by memory cells that are programmed to logic 0 with a negative voltage and read with a positive voltage. Unlike the distributions in FIG. 6A, the distributions 801 and 803 do not overlap. Other embodiments can have distributions that have minimum overlap. Because of the lack of (or minimal) overlap between the distributions, in one embodiment, access circuitry can accurately distinguish between the logic 0 and logic 1 memory cells based on a single-polarity read (e.g., $V_{DM1}$ of FIG. 6F or read pulses 514 or 530 of FIGS. 5A and 5B). Therefore, in one such embodiment, the second voltage of the double-polarity read sequence (e.g., $V_{DM2}$ of FIG. 6F or read pulses 516 or 532 of FIGS. 5A and 5B) can be skipped. Even if an overlap is present (not shown) involving a number of cells sufficiently small for possible errors to be corrected by an ECC, access circuitry can skip or omit the second voltage of the double-polarity read sequence. In such embodiments, access circuitry can determine whether or not to apply the second voltage based on an error rate.

FIG. 8B illustrates a method of performing a double-polarity read in which the second voltage is conditioned upon the ability of an error correction code to detect or correct errors, in accordance with an embodiment. Similar to the method 700A of FIG. 7A, the method 800B of FIG. 8 begins with applying a first voltage with a first polarity to a plurality of memory cells, at operation 802.

After applying the first voltage, access circuitry determines whether or not the ECC mechanisms are sufficient to detect (and optionally correct) the errors resulting from the read based on the first voltage. For example, in one embodiment, access circuitry determines if the error rate is greater than or equal to an error threshold. If the error rate is greater than or equal to an error threshold, 804 YES branch, the access circuitry outputs the data from the memory of cells, at operation 806, without applying the second voltage. According to one embodiment, the memory read is faster and consumes less energy when the output can be determined without applying the second voltage.

If the error rate is less than the error threshold, 804 NO branch, access circuitry applies a second voltage with a second polarity to one or more of the plurality of memory cells, at operation 808. The access circuitry can then determine the logic state of the one or more memory cells based on the electrical responses to the first and second voltages, at operation 810. Although FIG. 8B describes conditioning the second voltage upon the ability of an ECC to detect errors, other embodiments can condition the application of the second voltage upon other triggering events. Examples of other triggering events include: detection of anomalous operating conditions such as detection of a temperature or supply voltage that is out of an expected range, or a user's command-based trigger (e.g., to activate the double-polarity read from a previous single polarity read operation).

Figure 9A:
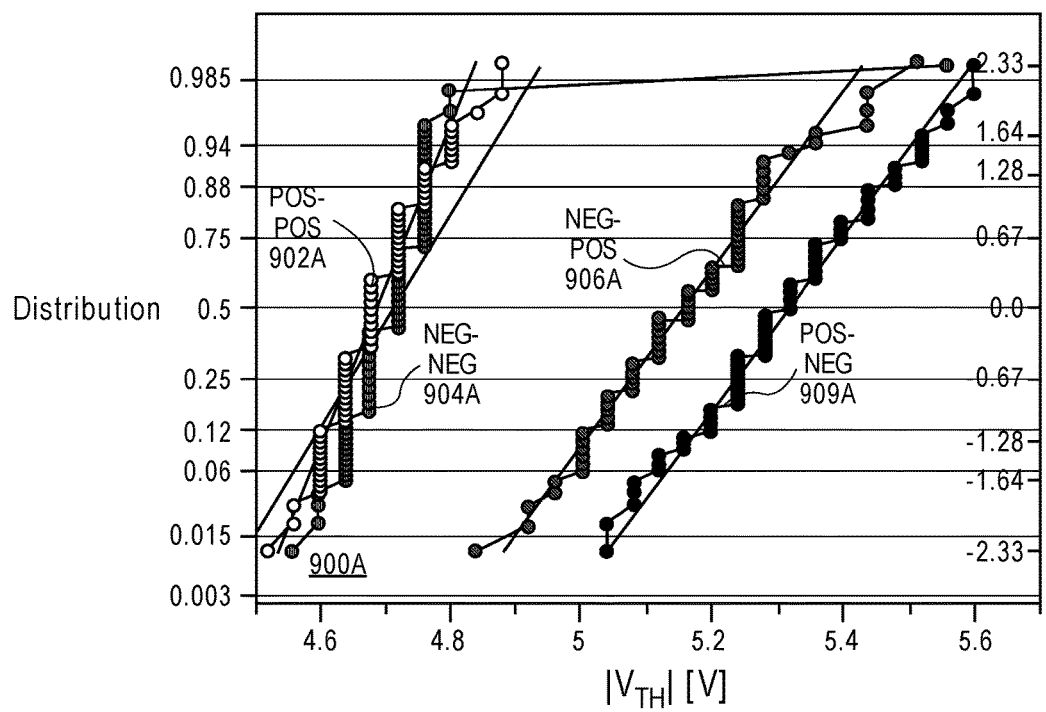
FIGS. 9A and 9B are graphs illustrating experimental data showing threshold voltages exhibited by memory cells at different locations on a wafer, in accordance with an embodiment.
Figure 9B:
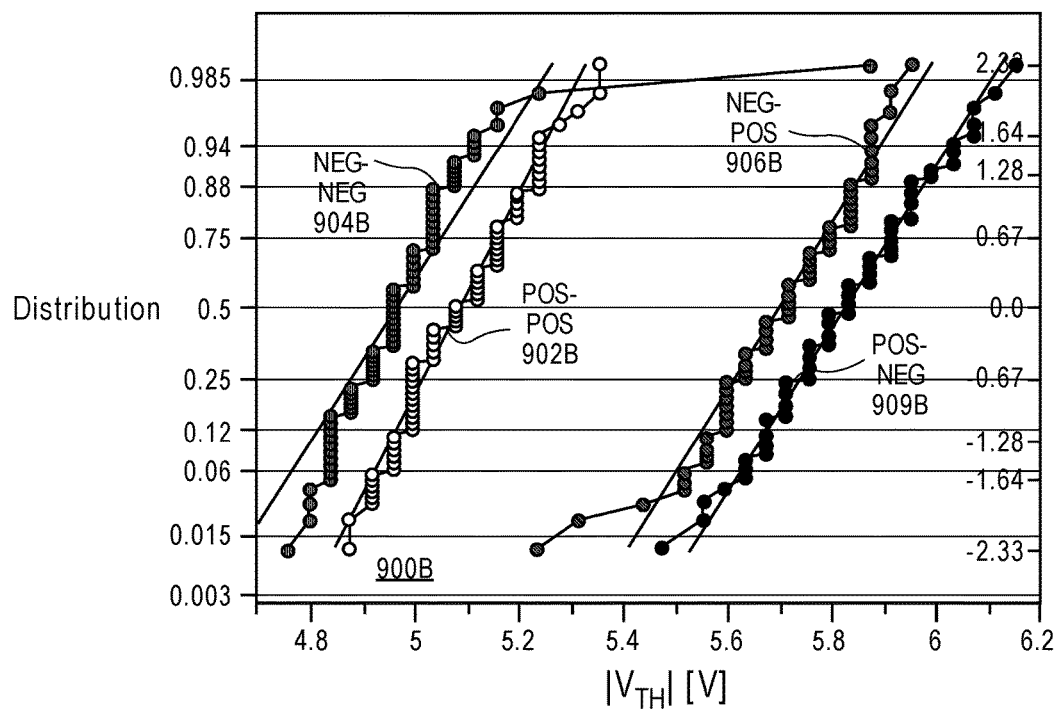

FIGS. 9A and 9B are graphs illustrating distributions of experimental data showing threshold voltages exhibited by memory cells at different locations on a wafer, in accordance with an embodiment. FIGS. 9A and 9B include data collected from different sites on a wafer. FIG. 9A is a graph 900A that includes data collected from the top of a wafer, and FIG. 9B is a graph 900B that includes data collected from the central region of a wafer (e.g., a region between the top and bottom of the wafer). Note that the threshold voltage values are shown in absolute value to allow superimposition of positive read and negative read thresholds on the same graph.

As explained above, memory cells that are programmed and read with the same polarity exhibit a lower threshold voltage, as shown by lines 902A, 904A, 902B, and 904B. Lines 902A and 902B show the threshold voltage magnitudes exhibited by memory cells that are programmed and read with a positive polarity. Lines 904A and 904B show the threshold voltage magnitudes exhibited by memory cells that are programmed and read with a negative polarity. Also explained above, memory cells that are programmed with one polarity and read with a different polarity exhibit a higher threshold voltage, as shown by lines 906A, 909A, 906B, and 909B. Lines 906A and 906B show the threshold voltage magnitudes exhibited by memory cells that are programmed with a negative polarity and read with a positive polarity. Lines 909A and 909B show the threshold voltage magnitudes exhibited by memory cells that are programmed with a positive polarity and read with a negative polarity.

As can be seen from the graphs 900A and 900B, the graphs 900A and 900B show lower and higher distributions of threshold voltage magnitudes. However, the threshold voltage distributions are not necessarily symmetrical. Furthermore, the examples illustrated in graphs 900A and 900B show windows between the lower and higher threshold distributions, but the higher tail of the lower distributions overlap with the lower tail of the higher distributions.

FIG. 9C includes tables that shows the threshold voltages at different percentiles of the distributions illustrated in FIGS. 9A and 9B. Tables 920, 922, 924, and 926 show the threshold voltages at the $12^{th}$ percentile, $50^{th}$ percentile, and $88^{th}$ percentile for memory cells programmed to logic 1 or 0 and at different sites on a wafer. Table 920 illustrates threshold voltages exhibited by memory cells located at the top of a wafer and programmed to logic 1 with a positive voltage, in accordance with an embodiment. Table 922 illustrates threshold voltages exhibited by memory cells located at the top of a wafer and programmed to logic 0 with a negative voltage, in accordance with an embodiment. Table 924 illustrates threshold voltages exhibited by memory cells located in the central region of a wafer and programmed to logic 1 with a positive voltage, in accordance with an embodiment. Table 926 illustrates threshold voltages exhibited by memory cells located in the central region of a wafer and programmed to logic 0 with a negative voltage, in accordance with an embodiment. As can be seen from the experimental data in FIG. 9C, a threshold window ($V_{TH}(0)$-$V_{TH}(1)$) is present for both positive and negative reads. In the illustrated embodiment, the threshold window is approximately 0.6±0.2V.

Figure 10A:
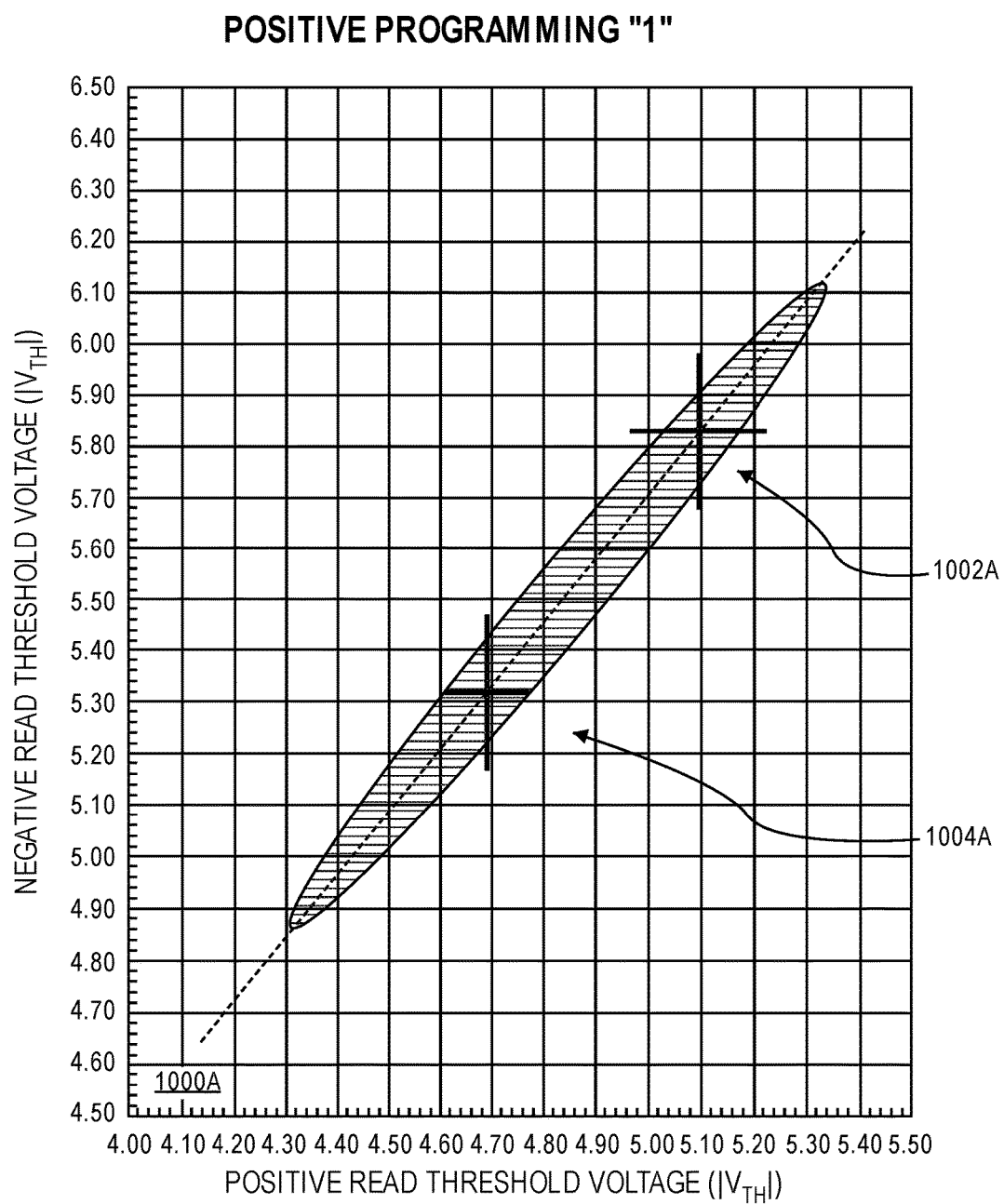
FIGS. 10A-10C are graphs illustrating experimental data showing threshold voltages exhibited by memory cells at different locations on a wafer, in accordance with an embodiment.
Figure 10B:
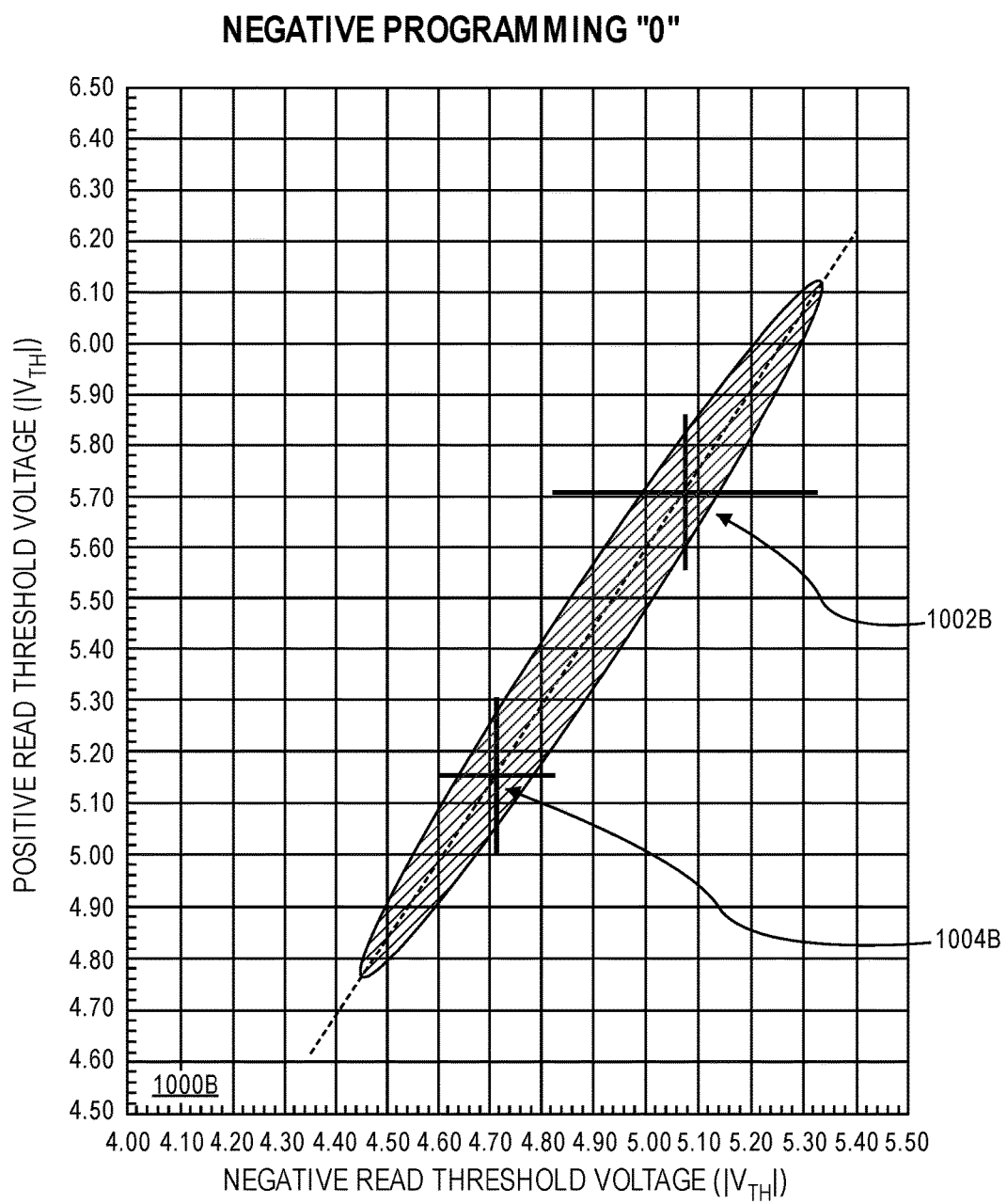
Figure 10C:
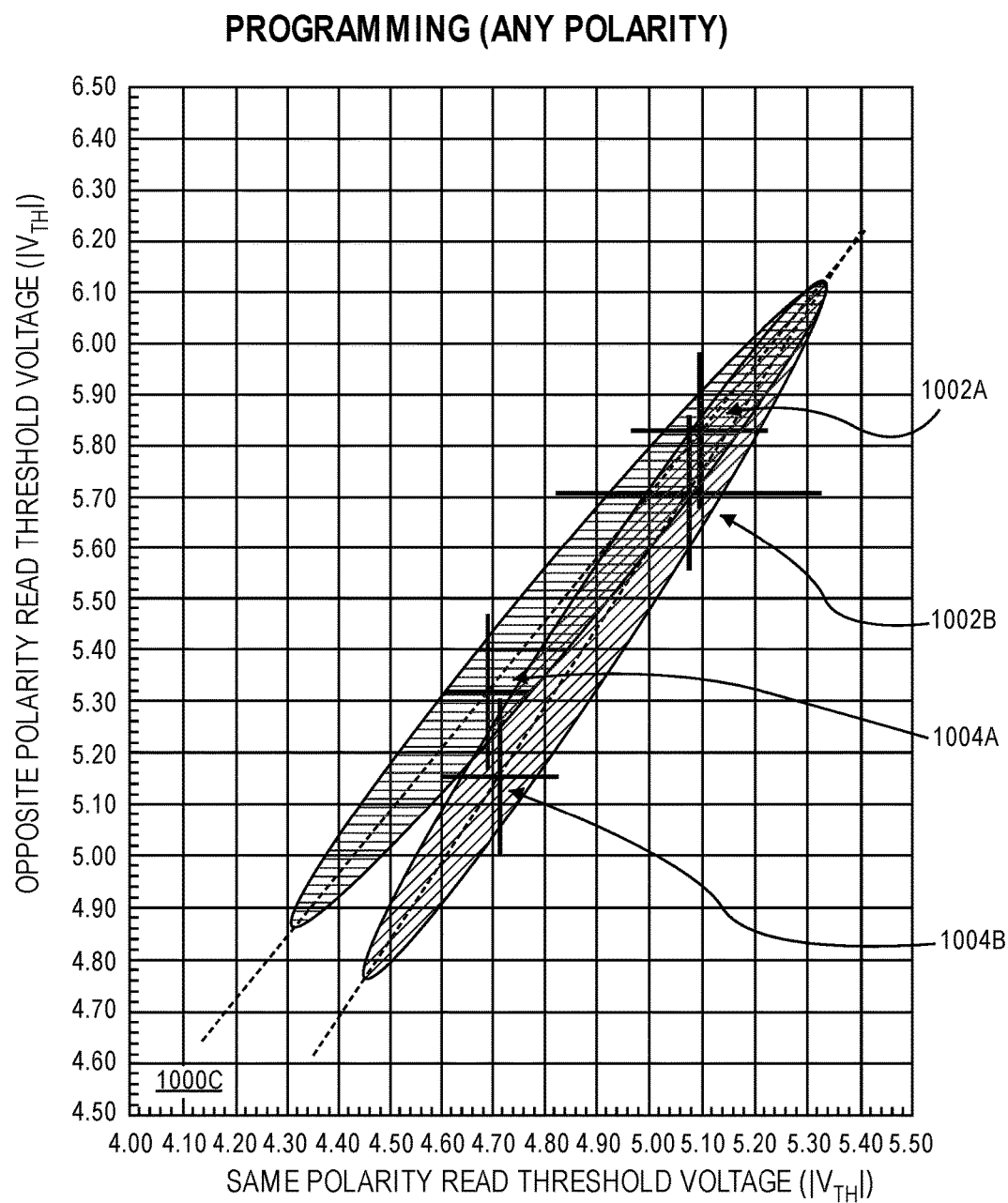

FIGS. 10A-10C are graphs illustrating the experimental data of FIGS. 9A-9C, in accordance with an embodiment. Note that the graphs of FIGS. 10A-10C show the absolute value of the threshold voltage.

FIG. 10A is a graph 1000A that includes experimental data for memory cells programmed to logic 1 with a positive voltage, in accordance with an embodiment. Lines 1002A show threshold voltage magnitudes exhibited by memory cells in the central region of a wafer, in accordance with an embodiment. Lines 1004A show threshold voltage magnitudes exhibited by memory cells at the top of a wafer, in accordance with an embodiment.

FIG. 10B is a graph 1000B that includes experimental data for memory cells programmed to a logic 0 with a negative voltage, in accordance with an embodiment. Lines 1002B show threshold voltage magnitudes exhibited by memory cells in the central region of a wafer, in accordance with an embodiment. Lines 1004B show threshold voltage magnitudes exhibited by memory cells at the top of a wafer, in accordance with an embodiment.

FIG. 10C is a graph 1000C that superimposes the experimental data from graphs 1000A and 1000B.

The x-axes of graphs 1000A, 1000B and 1000C are the threshold voltages exhibited in response to a same polarity read voltage (e.g., the polarity of both the programming voltage and read voltage are the same). Therefore, the x-axis of graph 1000A shows the threshold voltage magnitudes in response to a positive voltage. The x-axis of graph 1000B shows the threshold voltage magnitudes in response to a negative voltage. The y-axes of graphs 1000A, 1000B, and 1000C are the threshold voltages exhibited in response to an opposite polarity read voltage (e.g., the polarity of the read voltage is the opposite of the polarity of the programming voltage). Therefore, the y-axis of graph 1000A shows the threshold voltage magnitudes in response to a negative voltage. The y-axis of graph 1000B shows the threshold voltage magnitudes in response to a positive voltage. Accordingly, the vertical lines show a distribution of threshold voltage magnitudes in response to an opposite polarity read voltage. The horizontal lines show a distribution of threshold voltage magnitudes in response to a same polarity read.

In the illustrated embodiments, the difference between the higher and lower threshold voltage magnitudes can vary in the 0.4-0.8 range, with a typical different of approximate 0.6V (at the $50^{th}$ percentile of the distributions). However, other embodiments can include other threshold voltage windows. As can be seen from the graphs 1000A, 1000B, and 1000C, memory cells that are on the higher end of the distribution in response to a voltage with one polarity remain on the higher end of distribution in response to a voltage with the opposite polarity. Similarly, memory cells that are on the lower end of the distribution in response to a voltage with one polarity remain on the lower end in response to a voltage with the opposite polarity.

FIG. 11 is a block diagram of a system that can perform a double-polarity read, in accordance with an embodiment.

System 1100 includes a processor 1110. The processor 1110 represents a processing unit of a host computing platform that executes an operating system (OS) and applications, which can collectively be referred to as a "host" for the memory. The OS and applications execute operations that result in memory accesses. Processor 1110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. System 1100 can be implemented as an SOC (system on a chip), or be implemented with standalone components.

Memory controller 1120 represents one or more memory controller circuits or devices for system 1100. Memory controller 1120 represents control logic that generates memory access commands in response to the execution of operations by processor 1110. Memory controller 1120 accesses memory 1130. In one embodiment, memory controller 1120 is part of host processor 1110, such as logic implemented on the same die or implemented in the same package space as the processor.

Memory controller 1120 includes I/O interface logic 1122 to couple to a system bus or a memory bus or both. I/O interface logic 1122 (as well as I/O interface logic 1132 of memory device 1130) can include pins, pads, connectors, signal lines, traces, or wires, or other hardware to connect the devices, or a combination of these. I/O interface logic 1122 can include a hardware interface. As illustrated, I/O interface logic 1122 includes at least drivers/transceivers for signal lines. Commonly, wires within an integrated circuit interface couple with a pad, pin, or connector to interface signal lines or traces or other wires between devices. I/O interface logic 1122 can include drivers, receivers, transceivers, or termination, or other circuitry or combinations of circuitry to exchange signals on the signal lines between the devices. The exchange of signals includes at least one of transmit or receive. While shown as coupling I/O 1122 from memory controller 1120 to I/O 1132 of memory 1130, it will be understood that in an implementation of system 1100 where groups of memory devices are accessed in parallel, multiple memory devices can include I/O interfaces to the same interface of memory controller 1120.

Multiple signal lines couple the memory controller 1120 with memory 1130. In the illustrated example, such signal lines include clock (CLK) 1131, command/address (CMD) and write data (DQ) 1134, read DQ 1135, and zero or more other signal lines 1138. In one embodiment, a bus or connection between memory controller 1120 and memory 1130 can be referred to as a memory bus or system bus. The signal lines for CMD can be referred to as a "C/A bus" (or ADD/CMD bus, or some other designation indicating the transfer of commands and address information). The signal lines for write and read DQ can be referred to as a "data bus." The system 1100 can be considered to have multiple "system buses," in the sense that an independent interface path can be considered a separate system bus. It will be understood that in addition to the lines explicitly shown, a system bus can include strobe signaling lines, alert lines, auxiliary lines, and other signal lines.

Memory 1130 represents memory resources for system 1100. In one embodiment, memory 1130 is one of a plurality of memory devices. In one such embodiment, each memory device is a separate memory die. Each memory device 140 includes I/O interface logic 1132, which has a bandwidth determined by the implementation of the device (e.g., ×16 or ×8 or some other interface bandwidth). I/O interface logic 1132 enables the memory devices to interface with memory controller 1120. I/O interface logic 1132 can include a hardware interface, and can be in accordance with I/O 1122 of memory controller, but at the memory device end. In one embodiment, multiple memory devices are connected in parallel to the same data buses.

In one embodiment, memory 1130 is disposed directly on a motherboard or host system platform (e.g., a PCB (printed circuit board) on which processor 1110 is disposed) of a computing device. In one embodiment, memory devices can be organized into memory modules. In one embodiment, memory modules represent dual inline memory modules (DIMMs). In one embodiment, memory modules 130 represent other organization of multiple memory devices to share at least a portion of access or control circuitry, which can be a separate circuit, a separate device, or a separate board from the host system platform. Memory modules can include multiple memory devices, and the memory modules can include support for multiple separate channels to the included memory devices disposed on them.

Memory 1130 includes an array 1140 of memory cells. A memory cell is a device or location for storing data. In one embodiment, an array 1140 of memory cells is managed as rows of data, accessed via wordline (rows) and bitline (individual bits within a row) control. In one embodiment, the array 1140 of memory cells includes a 3D crosspoint array such as the memory cell array 200 of FIG. 2. The array 1140 of memory cells can be organized as separate channels, ranks, and banks of memory. Channels are independent control paths to storage locations within memory 1130. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

Referring again to the memory controller 1120, in one embodiment, memory controller 1120 includes refresh (REF) logic 1126. Refresh logic 1126 can be used where memory 1130 is volatile and needs to be refreshed to maintain a deterministic state. In one embodiment, refresh logic 1126 indicates a location for refresh, and a type of refresh to perform. Refresh logic 1126 can trigger self-refresh within memory 1130, and issue external refreshes by sending refresh commands to trigger the execution of a refresh operation. However, as explained above, a consequence of performing a double-polarity read sequence is the refresh of most of the accessed memory cells, in accordance with an embodiment. In one embodiment, access circuitry 1142 performs a refresh (e.g., reprogramming) of any of the accessed memory cells that were not refreshed by the double-polarity read sequence. Therefore, a complete refresh of memory cells can be achieved as mostly a side effect of the memory read sequence with minimal additional refresh operations. Accordingly, in one embodiment, the double-polarity read sequence reduces the need to perform separate memory refreshes. In the embodiment illustrated in FIG. 11, the memory controller 1120 includes error correction circuitry 1161. The error detection/correction circuitry 1161 can include hardware logic to implement an error correction code (ECC) to detect errors occurring in data read from memory 1130. In one embodiment, error detection/correction circuitry 1161 also corrects errors (up to a certain error rate based on the implemented ECC code). However, in other embodiments, error detection/correction circuitry 1161 only detects but does not correct errors.

In the illustrated embodiment, the memory controller 1120 includes command (CMD) logic 1124, which represents logic or circuitry to generate commands to send to memory 1130. Typically, the signaling in memory subsystems includes address information within or accompanying the command to indicate or select one or more memory locations where the memory devices should execute the command. In one embodiment, memory 1130 include decode circuitry 1160 to receive and decode command and address information received via I/O 1132 from memory controller 1120.

Based on the received command and address information, access circuitry 1142 performs operations to execute the commands. In one embodiment, in response to receiving a read command, the access circuitry 1142 performs a double-polarity read sequence in accordance with any embodiment described herein. For example, in one embodiment, the access circuitry 1142 performs a double-polarity read in accordance with the method 700A of FIG. 7A, the method 700B of FIG. 7B, or the method 800B of FIG. 8B. For example, in one embodiment the access circuitry is to apply a first voltage with a first polarity to a plurality of the memory cells of array 1140, and apply a second voltage with a second polarity to one or more of the plurality of memory cells. The access circuitry can then determine the logic states of the one or more memory cells based on the electrical responses of the one or more memory cells to the first voltage and the second voltage. In one such embodiment, the memory 1130 includes sense circuitry 1143 to detect electrical responses of the one or more memory cells to the first voltage and the second voltage. In one embodiment, the sense circuitry 1143 include sense amplifiers. FIG. 11 illustrates the access circuitry 1142 and sense circuitry 1143 as being embedded in the memory 1130, however, other embodiments can include access circuitry and/or sense circuitry that is separate from the memory 1130. For example, access circuitry and sense circuitry can be included in a memory controller such as the memory controller 1120.

In one embodiment, memory 1130 includes one or more registers 1136. The registers 1136 represent one or more storage devices or storage locations that provide configuration or settings for the operation of the memory 1130. In one embodiment, the registers 1136 can provide a storage location for memory device 1130 to store data for access by memory controller 1120 as part of a control or management operation. In one embodiment, registers 1136 include one or more Mode Registers. In one embodiment, registers 1136 include one or more multipurpose registers. The configuration of locations within registers 1136 can configure memory 1130 to operate in different "modes," where command information can trigger different operations within memory 1130 based on the mode. Additionally, or in the alternative, different modes can also trigger different operation from address information or other signal lines depending on the mode. In one embodiment, the access circuitry 1142 can perform a single-polarity or double-polarity read based on a read mode as indicated by the registers 1136.

In one embodiment, whether or not the second voltage of the double-polarity read sequence is conditional upon an error status of the memory 1130. For example, in one embodiment, if the error correction circuitry 1161 is able to correct errors in the data read from memory 1130 with a first voltage pulse (e.g., $V_{DM1}$ of FIG. 6F), then the second voltage pulse (e.g., $V_{DM2}$ of FIG. 6F) can be skipped. By not applying the second voltage pulse of the read sequence, the read access time can be decreased. In the case where uncorrected errors are present, for example the error correction circuitry 1161 is unable to correct all the errors in the data read from memory 1130, the access circuitry 1142 can apply the second voltage (e.g., $V_{DM2}$ of FIG. 6F) to enable substantially error-free access.

Figure 12:
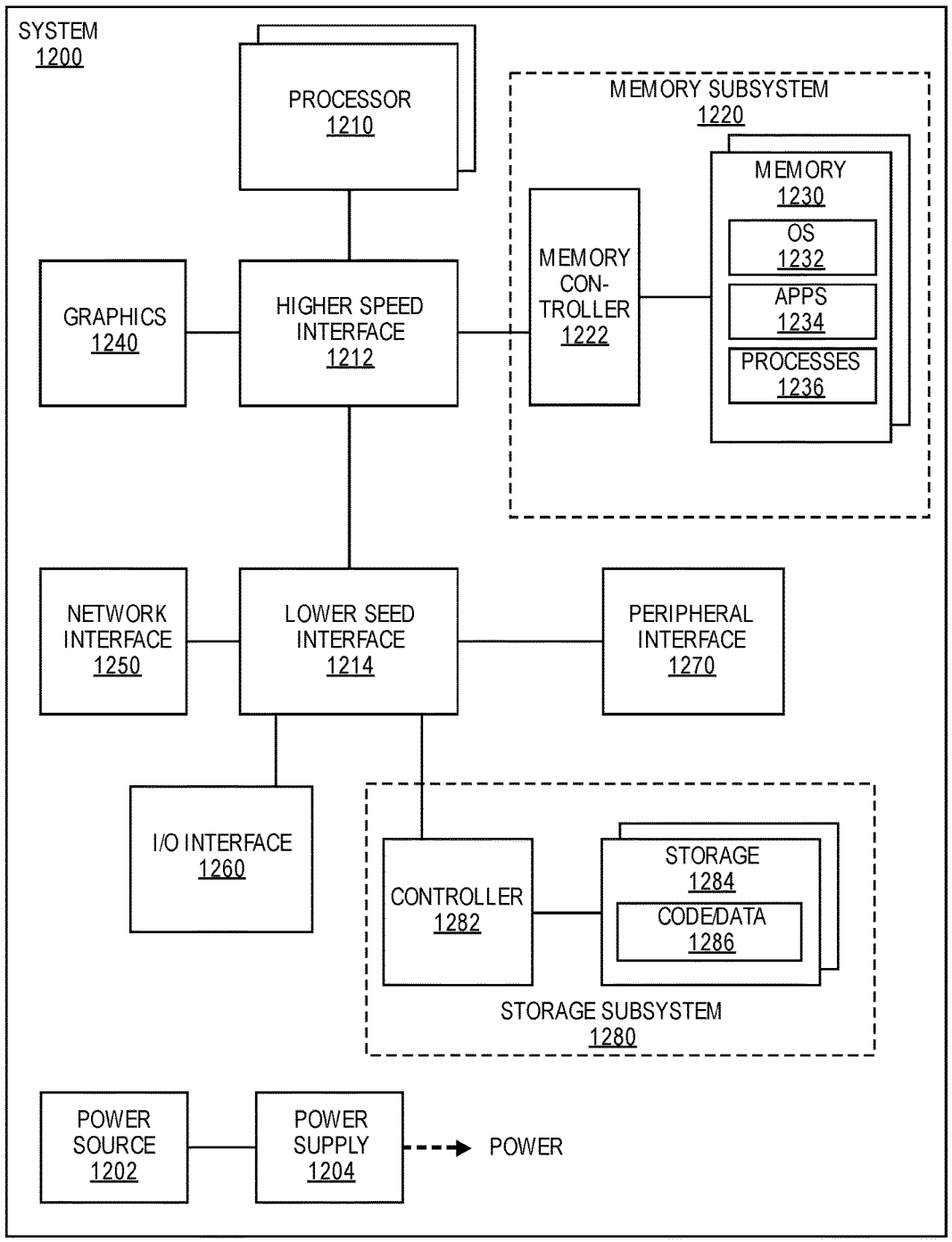
FIG. 12 is a block diagram of a computing system in which double-polarity reading can be implemented, in accordance with an embodiment.

FIG. 12 is a block diagram of a computing system in which double-polarity reading can be implemented, in accordance with an embodiment.

System 1200 represents a computing device in accordance with any embodiment described herein, and can be a laptop computer, a desktop computer, a server, a gaming or entertainment control system, a scanner, copier, printer, routing or switching device, embedded computing device, or other electronic device.

System 1200 includes processor 1210, which provides processing, operation management, and execution of instructions for system 1200. Processor 1210 can include any type of microprocessor, central processing unit (CPU), graphics processing unit (GPU), processing core, or other processing hardware to provide processing for system 1200, or a combination of processors. Processor 1210 controls the overall operation of system 1200, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 1200 includes interface 1212 coupled to processor 1210, which can represent a higher speed interface or a high throughput interface for system components that needs higher bandwidth connections, such as memory subsystem 1220 or graphics interface components 1240. Interface 1212 can represent a "north bridge" circuit, which can be a standalone component or integrated onto a processor die. Graphics interface 1240 interfaces to graphics components for providing a visual display to a user of system 1200. In one embodiment, graphics interface 1240 generates a display based on data stored in memory 1230 or based on operations executed by processor 1210 or both.

Memory subsystem 1220 represents the main memory of system 1200, and provides storage for code to be executed by processor 1210, or data values to be used in executing a routine. Memory subsystem 1220 can include one or more memory devices 1230 such as read-only memory (ROM), flash memory, one or more varieties of random access memory (RAM), or other memory devices, or a combination of such devices. In one embodiment, the memory devices 1230 are self-selector memory devices. In one embodiment, the memory devices 1230 can be read with a double-polarity read sequence as described herein. In one such embodiment, the memory subsystem 1220 includes circuitry (such as the access circuitry 1142 of FIG. 11) to apply a first voltage with a first polarity and a second voltage with a second polarity to read the memory cells in the memory devices 1230, and determine the logic state of the memory cells based on the electrical responses to the first and second voltages. In one such embodiment, the memory devices include arrays of self-selector memory cells with a chalcogenide glass to function as both a selector and storage element, as described above with respect to FIG. 1.

Memory 1230 stores and hosts, among other things, operating system (OS) 1232 to provide a software platform for execution of instructions in system 1200. Additionally, applications 1234 can execute on the software platform of OS 1232 from memory 1230. Applications 1234 represent programs that have their own operational logic to perform execution of one or more functions. Processes 1236 represent agents or routines that provide auxiliary functions to OS 1232 or one or more applications 1234 or a combination. OS 1232, applications 1234, and processes 1236 provide logic to provide functions for system 1200. In one embodiment, memory subsystem 1220 includes memory controller 1222, which is a memory controller to generate and issue commands to memory 1230. It will be understood that memory controller 1222 could be a physical part of processor 1210 or a physical part of interface 1212. For example, memory controller 1222 can be an integrated memory controller, integrated onto a circuit with processor 1210.

While not specifically illustrated, it will be understood that system 1200 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 1200 includes interface 1214, which can be coupled to interface 1212. Interface 1214 can be a lower speed interface than interface 1212. In one embodiment, interface 1214 can be a "south bridge" circuit, which can include standalone components and integrated circuitry. In one embodiment, multiple user interface components or peripheral components, or both, couple to interface 1214. Network interface 1250 provides system 1200 the ability to communicate with remote devices (e.g., servers or other computing devices) over one or more networks. Network interface 1250 can include an Ethernet adapter, wireless interconnection components, USB (universal serial bus), or other wired or wireless standards-based or proprietary interfaces. Network interface 1250 can exchange data with a remote device, which can include sending data stored in memory or receiving data to be stored in memory.

In one embodiment, system 1200 includes one or more input/output (I/O) interface(s) 1260. I/O interface 1260 can include one or more interface components through which a user interacts with system 1200 (e.g., audio, alphanumeric, tactile/touch, or other interfacing). Peripheral interface 1270 can include any hardware interface not specifically mentioned above. Peripherals refer generally to devices that connect dependently to system 1200. A dependent connection is one where system 1200 provides the software platform or hardware platform or both on which operation executes, and with which a user interacts.

In one embodiment, system 1200 includes storage subsystem 1280 to store data in a nonvolatile manner. In one embodiment, in certain system implementations, at least certain components of storage 1280 can overlap with components of memory subsystem 1220. Storage subsystem 1280 includes storage device(s) 1284, which can be or include any conventional medium for storing large amounts of data in a nonvolatile manner, such as one or more magnetic, solid state, or optical based disks, or a combination. Storage 1284 holds code or instructions and data 1286 in a persistent state (i.e., the value is retained despite interruption of power to system 1200). Storage 1284 can be generically considered to be a "memory," although memory 1230 is typically the executing or operating memory to provide instructions to processor 1210. Whereas storage 1284 is nonvolatile, memory 1230 can include volatile memory (i.e., the value or state of the data is indeterminate if power is interrupted to system 1200). In one embodiment, storage subsystem 1280 includes controller 1282 to interface with storage 1284. In one embodiment controller 1282 is a physical part of interface 1214 or processor 1210, or can include circuits or logic in both processor 1210 and interface 1214.

Power source 1202 provides power to the components of system 1200. More specifically, power source 1202 typically interfaces to one or multiple power supplies 1204 in system 1202 to provide power to the components of system 1200. In one embodiment, power supply 1204 includes an AC to DC (alternating current to direct current) adapter to plug into a wall outlet. Such AC power can be renewable energy (e.g., solar power) power source 1202. In one embodiment, power source 1202 includes a DC power source, such as an external AC to DC converter. In one embodiment, power source 1202 or power supply 1204 includes wireless charging hardware to charge via proximity to a charging field. In one embodiment, power source 1202 can include an internal battery or fuel cell source.

Figure 13:
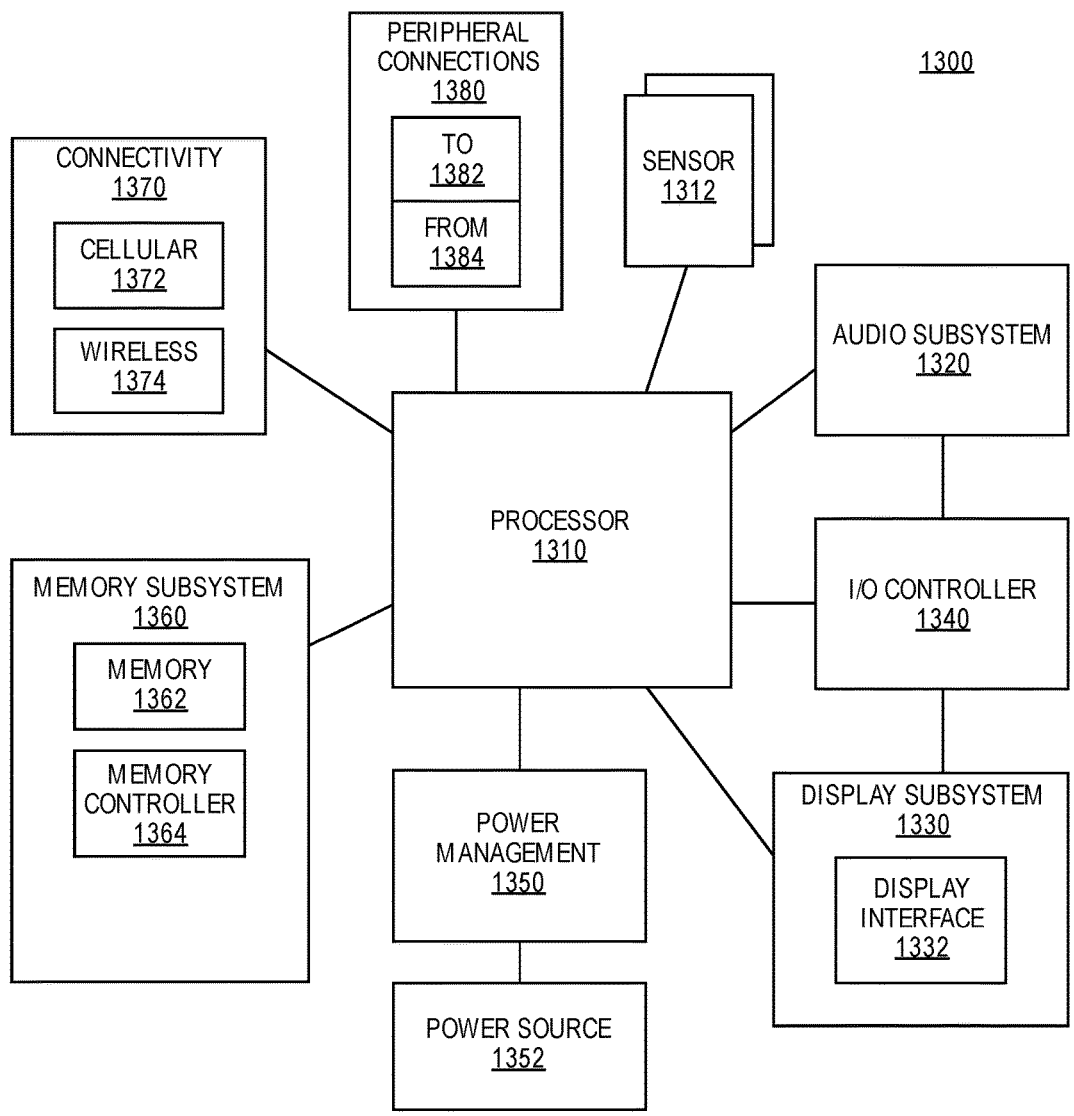
FIG. 13 is a block diagram of a mobile device in which double-polarity reading can be implemented, in accordance with an embodiment.

FIG. 13 is a block diagram of a mobile device in which double-polarity reading can be implemented, in accordance with an embodiment. Device 1300 represents a mobile computing device, such as a computing tablet, a mobile phone or smartphone, a wireless-enabled e-reader, wearable computing device, or other mobile device, or an embedded computing device. It will be understood that certain of the components are shown generally, and not all components of such a device are shown in device 1300.

Device 1300 includes processor 1310, which performs the primary processing operations of device 1300. Processor 1310 can include one or more physical devices, such as microprocessors, application processors, microcontrollers, programmable logic devices, or other processing means. The processing operations performed by processor 1310 include the execution of an operating platform or operating system on which applications and device functions are executed. The processing operations include operations related to I/O (input/output) with a human user or with other devices, operations related to power management, operations related to connecting device 1300 to another device, or a combination. The processing operations can also include operations related to audio I/O, display I/O, or other interfacing, or a combination. Processor 1310 can execute data stored in memory. Processor 1310 can write or edit data stored in memory.

In one embodiment, system 1300 includes one or more sensors 1312. Sensors 1312 represent embedded sensors or interfaces to external sensors, or a combination. Sensors 1312 enable system 1300 to monitor or detect one or more conditions of an environment or a device in which system 1300 is implemented. Sensors 1312 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, glucose monitors, or other sensors to detect medical or physiological attributes), or other sensors, or a combination. Sensors 1312 can also include sensors for biometric systems such as fingerprint detectors, face detection or recognition systems, or other systems that detect or recognize user features. Sensors 1312 should be understood broadly, and not limiting on the many different types of sensors that could be implemented with system 1300. In one embodiment, one or more sensors 1312 couples to processor 1310 via a frontend circuit integrated with processor 1310. In one embodiment, one or more sensors 1312 couples to processor 1310 via another component of system 1300.

In one embodiment, device 1300 includes audio subsystem 1320, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1300, or connected to device 1300. In one embodiment, a user interacts with device 1300 by providing audio commands that are received and processed by processor 1310.

Display subsystem 1330 represents hardware (e.g., display devices) and software components (e.g., drivers) that provide a visual display for presentation to a user. In one embodiment, the display includes tactile components or touchscreen elements for a user to interact with the computing device. Display subsystem 1330 includes display interface 1332, which includes the particular screen or hardware device used to provide a display to a user. In one embodiment, display interface 1332 includes logic separate from processor 1310 (such as a graphics processor) to perform at least some processing related to the display. In one embodiment, display subsystem 1330 includes a touchscreen device that provides both output and input to a user. In one embodiment, display subsystem 1330 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem 1330 generates display information based on data stored in memory and operations executed by processor 1310.

I/O controller 1340 represents hardware devices and software components related to interaction with a user. I/O controller 1340 can operate to manage hardware that is part of audio subsystem 1320, or display subsystem 1330, or both. Additionally, I/O controller 1340 illustrates a connection point for additional devices that connect to device 1300 through which a user might interact with the system. For example, devices that can be attached to device 1300 might include microphone devices, speaker or stereo systems, video systems or other display device, keyboard or keypad devices, or other I/O devices for use with specific applications such as card readers or other devices.

As mentioned above, I/O controller 1340 can interact with audio subsystem 1320 or display subsystem 1330 or both. For example, input through a microphone or other audio device can provide input or commands for one or more applications or functions of device 1300. Additionally, audio output can be provided instead of or in addition to display output. In another example, if display subsystem includes a touchscreen, the display device also acts as an input device, which can be at least partially managed by I/O controller 1340. There can also be additional buttons or switches on device 1300 to provide I/O functions managed by I/O controller 1340.

In one embodiment, I/O controller 1340 manages devices such as sensors 1312, accelerometers, cameras, light sensors or other environmental sensors, gyroscopes, global positioning system (GPS), or other hardware that can be included in device 1300. The input can be part of direct user interaction, as well as providing environmental input to the system to influence its operations (such as filtering for noise, adjusting displays for brightness detection, applying a flash for a camera, or other features).

In one embodiment, device 1300 includes power management 1350 that manages battery power usage, charging of the battery, and features related to power saving operation. Power management 1350 manages power from power source 1352, which provides power to the components of system 1300. In one embodiment, power source 1352 includes an AC to DC (alternating current to direct current) adapter to plug into a wall outlet. Such AC power can be renewable energy (e.g., solar power, motion based power). In one embodiment, power source 1352 includes only DC power, which can be provided by a DC power source, such as an external AC to DC converter. In one embodiment, power source 1352 includes wireless charging hardware to charge via proximity to a charging field. In one embodiment, power source 1352 can include an internal battery or fuel cell source.

Memory subsystem 1360 includes memory device(s) 1362 for storing information in device 1300. Memory subsystem 1360 can include nonvolatile (state does not change if power to the memory device is interrupted) or volatile (state is indeterminate if power to the memory device is interrupted) memory devices, or a combination. In one embodiment, the memory 1362 can be read with a double-polarity read sequence as described herein. In one such embodiment, the memory subsystem 1360 includes circuitry (such as the access circuitry 1142 of FIG. 11) to apply a first voltage with a first polarity and a second voltage with a second polarity to read the memory cells in the memory 1362, and determine the logic state of the memory cells based on the electrical responses to the first and second voltages. In one such embodiment, the memory devices include arrays of self-selector memory cells with a chalcogenide glass to function as both a selector and storage element, as described above with respect to FIG. 1. Memory 1360 can store application data, user data, music, photos, documents, or other data, as well as system data (whether long-term or temporary) related to the execution of the applications and functions of system 1300. In one embodiment, memory subsystem 1360 includes memory controller 1364 (which could also be considered part of the control of system 1300, and could potentially be considered part of processor 1310). Memory controller 1364 includes a scheduler to generate and issue commands to memory device 1362.

Connectivity 1370 includes hardware devices (e.g., wireless or wired connectors and communication hardware, or a combination of wired and wireless hardware) and software components (e.g., drivers, protocol stacks) to enable device 1300 to communicate with external devices. The external device could be separate devices, such as other computing devices, wireless access points or base stations, as well as peripherals such as headsets, printers, or other devices. In one embodiment, system 1300 exchages data with an external device for storage in memory or for display on a display device. The exchanged data can include data to be stored in memory, or data already stored in memory, to read, write, or edit data.

Connectivity 1370 can include multiple different types of connectivity. To generalize, device 1300 is illustrated with cellular connectivity 1372 and wireless connectivity 1374. Cellular connectivity 1372 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1374 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1380 include hardware interfaces and connectors, as well as software components (e.g., drivers, protocol stacks) to make peripheral connections. It will be understood that device 1300 could both be a peripheral device ("to" 1382) to other computing devices, as well as have peripheral devices ("from" 1384) connected to it. Device 1300 commonly has a "docking" connector to connect to other computing devices for purposes such as managing (e.g., downloading, uploading, changing, synchronizing) content on device 1300. Additionally, a docking connector can allow device 1300 to connect to certain peripherals that allow device 1300 to control content output, for example, to audiovisual or other systems.

In addition to a proprietary docking connector or other proprietary connection hardware, device 1300 can make peripheral connections 1380 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Thus, a double-polarity read sequence can enable accurate reading of information from a double-polarity memory.

The following are some embodiments of the disclosure. In one embodiment, a circuit for accessing an array of memory cells includes access circuitry to apply a first voltage with a first polarity to a plurality of the memory cells, and apply a second voltage with a second polarity to one or more of the plurality of the memory cells. The circuit includes sense circuitry to detect electrical responses of the one or more memory cells to the first voltage and the second voltage. The access circuitry is to determine a logic state of the one or more memory cells based on the electrical responses of the one or more memory cells to the first voltage and the second voltage.

In one embodiment, the access circuitry is to determine whether a given memory cell of the array is in a first logic state or whether the given memory cell's logic state is inconclusive based on a first electrical response to the first voltage. In one embodiment, the access circuitry is to apply the second voltage with the second polarity to the given memory cell in response to a determination that the given memory cell's logic state is inconclusive based on the first electrical response. In one embodiment, the access circuitry is to determine that the given memory cell is in the first logic state or a second logic state based on a second electrical response to the second voltage at the second polarity. In one embodiment, the sense circuitry is to detect first current through the given memory cell in response to the first voltage, and the access circuitry is to determine the given memory cell is in the first logic state based on detection that a magnitude of the first current is greater than or equal to a first threshold. In one embodiment, the sense circuitry is to detect first current through the given memory cell in response to the first voltage, and the access circuitry is to determine the given memory cell's logic state is inconclusive based on detection that a magnitude of the first current is less than a first threshold.

In one embodiment, the sense circuitry is to detect second current through the given memory cell in response to the second voltage, and the access circuitry is to determine the given memory cell is at the first logic state based on detection that a magnitude of the second current is less than a second threshold. In one embodiment, the sense circuitry is to detect second current through the given memory cell in response to the second voltage, and the access circuitry is to determine the given memory cell is at a second logic state based on detection that a magnitude of the second current is greater than or equal to a second threshold. In one embodiment, the access circuitry is to apply the first voltage having a first magnitude, and apply the second voltage having a second magnitude greater than the first magnitude.

In one embodiment, the sense circuitry is to detect a threshold voltage for a given memory cell of the one or more memory cells in response to an applied voltage, wherein the applied voltage is one of the first or second voltages, wherein if the given memory cell is programmed with a same polarity as the applied voltage, the sense circuitry is to detect that the threshold voltage's magnitude is in a first range, and wherein if the given memory cell is programmed with a different polarity than the applied voltage, the sense circuitry is to detect that the threshold voltage's magnitude is in a second range. In one embodiment, an upper end of the first range overlaps a lower end of the second range. In one embodiment, the access circuitry is to apply the first voltage having the first magnitude that is lower than an expected lowest magnitude of the second range. In one embodiment, the access circuitry is to apply the second voltage having the second magnitude that is higher than an expected highest magnitude of the second range. In one embodiment, the access circuitry to apply the first voltage with the first polarity is to: apply a more positive voltage to a first terminal than to a second terminal of a given memory cell of the array, and the access circuitry to apply the second voltage with the second polarity is to: apply a more positive voltage to the second terminal than to the first terminal of the given memory cell of the array.

In one embodiment, the access circuitry is to refresh one or more of the memory cells via the application of the first voltage and the second voltage. In one embodiment, the access circuitry is to mask a given memory cell of the array from the second voltage based on a determination that the given memory cell is in the first logic state. In one embodiment, the application of the second voltage is based on a triggering event. In one such embodiment, the triggering event includes a determination that an error rate is greater than or equal to an error threshold.

In one embodiment, the sense circuitry to detect electrical responses is to detect one or more of: a voltage drop across terminals of a given memory cell of the array, current through the given memory cell, and a threshold event of the given memory cell. In one embodiment, detection of the threshold event includes detection of a threshold voltage across the terminals of the given memory cell. In one embodiment, the circuit further includes a mode register to indicate whether the access to apply the second voltage to given memory cells. In one such embodiment, the mode register is to indicate the access circuitry is to apply the second voltage based on detection of an error rate that is greater than or equal to an error threshold. In one embodiment, the circuit further includes an error rate register to store the error rate for the array of memory cells.

In one embodiment, a system includes a memory including an array of memory cells, and a circuit including access circuitry to apply a first voltage with a first polarity to a plurality of the memory cells, and apply a second voltage with a second polarity to one or more of the plurality of memory cells, and sense circuitry to detect electrical responses of the one or more memory cells to the first voltage and the second voltage, wherein the access circuitry is to determine a logic state of the one or more memory cells based on the electrical responses of the one or more memory cells to the first voltage and the second voltage. The circuit can be in accordance with any of the embodiments described herein. In one embodiment, the system further includes any of a display communicatively coupled to the memory, a network interface communicatively coupled to the memory, or a battery coupled to provide power to the system.

In one embodiment, a method of accessing an array of memory cells involves applying a first voltage with a first polarity to a plurality of the memory cells, applying, to one or more of the plurality of memory cells, a second voltage with a second polarity, detecting electrical responses of the one or more memory cells to the first voltage and the second voltage, and determining a logic state of the one or more memory cells based on the electrical responses of the one or more memory cells to the first voltage and the second voltage. In one embodiment, determining the logic state of the one or more memory cells involves determining whether a given memory cell of the array is in a first logic state or whether the given memory cell's logic state is inconclusive based on a first electrical response to the first voltage.

In one embodiment, a memory including an array of memory cells includes a first access line and a second access line to access a given memory cell of the array, and a storage material between the first access line and the second access line. The first access line and second access line are to be biased with a first voltage with a first polarity followed by a second voltage with a second polarity. The storage material of the given memory cell is to exhibit a first electrical response in response to the first voltage and a second electrical response to the second voltage, and a logic state of the given memory cell is determined based on the first response and the second response. In one embodiment, the storage material of the given memory cell comprises a self-selecting material to select the given memory cell and store the logic state. In one embodiment, the storage material includes a chalcogenide glass.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Operations can be combined or broken down into sub-operations. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method of accessing an array of memory cells comprising:
    applying a first voltage with a first polarity to a plurality of memory cells of the array;
    detecting first threshold voltages exhibited by the plurality of memory cells in response to application of the first voltage;
    determining that one or more of the plurality of memory cells are in a first logic state based on the first threshold voltages;
    applying a second voltage with a second polarity to at least memory cells that were not determined to be in the first logic state;
    detecting second threshold voltages exhibited by the memory cells in response to application of the second voltage; and
    determining whether the memory cells are in the first logic state or in a second logic state based on the first and second threshold voltages.

2. The method of claim 1, wherein the first and second threshold voltages are within a first range for a memory cell programmed with the first polarity and within a second range for a memory cell programmed with the second polarity, wherein the first range and second range partially overlap.

3. The method of claim 2, wherein the first voltage has a magnitude that is lower than an expected lowest magnitude of the second range.

4. The method of claim 2, wherein the second voltage has a magnitude that is higher than an expected highest magnitude of the second range.

5. The method of claim 1, further comprising:
    applying the second voltage only to the memory cells that were not determined to be in the first logic state.

6. The method of claim 1, wherein the second voltage has a magnitude greater than the first voltage.

7. The method of claim 1, wherein:
applying the first voltage comprises applying a more positive voltage to a first terminal than to a second terminal of a given memory cell of the array; and
applying the second voltage comprises applying a more positive voltage to the second terminal than to the first terminal of the given memory cell of the array.

8. The method of claim 1, wherein application of the second voltage is in response to a determination that an error rate is greater than or equal to a threshold.

9. A circuit for accessing an array of memory cells, the circuit comprising:
access circuitry to:
apply a first voltage with a first polarity to a plurality of memory cells of the array; and
sense circuitry to:
detect first threshold voltages exhibited by the plurality of memory cells in response to application of the first voltage;
wherein the access circuitry is to further:
determine that one or more of the plurality of memory cells are in a first logic state based on the first threshold voltages; and
apply a second voltage with a second polarity to at least memory cells that were not determined to be in the first logic state; and
wherein the sense circuitry is to further:
detect second threshold voltages exhibited by the memory cells in response to application of the second voltage; and
determine whether the memory cells are in the first logic state or in a second logic state based on the first and second threshold voltages.

10. The circuit of claim 9, wherein the first and second threshold voltages are within a first range for a memory cell programmed with the first polarity and within a second range for a memory cell programmed with the second polarity, wherein the first range and second range partially overlap.

11. The circuit of claim 10, wherein the first voltage has a magnitude that is lower than an expected lowest magnitude of the second range.

12. The circuit of claim 10, wherein the second voltage has a magnitude that is higher than an expected highest magnitude of the second range.

13. The circuit of claim 9, wherein the access circuitry is to:
apply the second voltage only to the memory cells that were not determined to be in the first logic state.

14. The circuit of claim 9, wherein the second voltage has a magnitude greater than the first voltage.

15. The circuit of claim 9, wherein:
application of the first voltage comprises application of a more positive voltage to a first terminal than to a second terminal of a given memory cell of the array; and
application of the second voltage comprises application of a more positive voltage to the second terminal than to the first terminal of the given memory cell of the array.

16. The circuit of claim 9, wherein application of the second voltage is in response to a determination that an error rate is greater than or equal to a threshold.

17. A system comprising:
a memory comprising an array of memory cells; and
a circuit communicatively coupled with the array of memory cells, the circuit comprising:
access circuitry to:
apply a first voltage with a first polarity to a plurality of memory cells of the array; and
sense circuitry to:
detect first threshold voltages exhibited by the plurality of memory cells in response to application of the first voltage;
wherein the access circuitry is to further:
determine that one or more of the plurality of memory cells are in a first logic state based on the first threshold voltages; and
apply a second voltage with a second polarity to at least memory cells that were not determined to be in the first logic state; and
wherein the sense circuitry is to further:
detect second threshold voltages exhibited by the memory cells in response to application of the second voltage; and
determine whether the memory cells are in the first logic state or in a second logic state based on the first and second threshold voltages.

18. The system of claim 17, wherein the first and second threshold voltages are within a first range for a memory cell programmed with the first polarity and within a second range for a memory cell programmed with the second polarity, wherein the first range and second range partially overlap.

19. The system of claim 17, wherein the memory comprises a three-dimensional (3D) crosspoint array.

20. The system of claim 17, further comprising any of a display communicatively coupled to the memory, a network interface communicatively coupled to the memory, or a battery coupled to provide power to the system.

* * * * *